US008004330B1

(12) United States Patent
Acimovic et al.

(10) Patent No.: US 8,004,330 B1
(45) Date of Patent: Aug. 23, 2011

(54) REDUCTION OF ELECTROMAGNETIC INTERFERENCE FOR DIFFERENTIAL SIGNALS

(75) Inventors: Predrag Acimovic, Burnaby (CA); Parmanand Mishra, Coquitlam (CA); Richard Wayne Hernandez, San Jose, CA (US)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 12/627,345

(22) Filed: Nov. 30, 2009

(51) Int. Cl.
*H03K 5/12* (2006.01)
(52) U.S. Cl. ........................................ 327/170; 327/108
(58) Field of Classification Search .................... None
See application file for complete search history.

(56) References Cited

U.S. PATENT DOCUMENTS

| 5,077,543 | A  |   | 12/1991 | Carlile |          |
|-----------|----|---|---------|---------|----------|
| 5,568,081 | A  | * | 10/1996 | Lui et al. | 327/380 |
| 6,300,788 | B1 | * | 10/2001 | Sher et al. | 326/21 |
| 6,362,672 | B1 | * | 3/2002  | Geist   | 327/170  |
| 6,636,069 | B1 | * | 10/2003 | Muljono | 326/30   |
| 6,751,782 | B2 | * | 6/2004  | Levin et al. | 326/87 |
| 6,906,567 | B2 | * | 6/2005  | Culler  | 327/170  |
| 7,339,409 | B2 | * | 3/2008  | Choi et al. | 327/170 |
| 7,425,849 | B2 | * | 9/2008  | Gupta et al. | 327/112 |
| 7,518,424 | B2 | * | 4/2009  | Yeh     | 327/170  |
| 7,696,808 | B2 | * | 4/2010  | Wong et al. | 327/384 |
| 7,839,200 | B2 | * | 11/2010 | Im et al. | 327/512 |

OTHER PUBLICATIONS

Predrag Acimovic; Novel Band-Stop Common Mode Filter for High-Speed Digital Data Transmission; Presentation Material for DesignCon 2007 (Santa Clara, California); Jan. 30, 2007; downloaded from <http://si-emc.com/Documents/DC07_Track12_Acimovic.pdf> on Nov. 10, 2009.

* cited by examiner

*Primary Examiner* — Cassandra Cox
(74) *Attorney, Agent, or Firm* — Knobbe Martens Olson & Bear LLP

(57) ABSTRACT

Apparatus and methods modulate the slew rate of high-speed edges of a differential digital signal. High-speed digital signals carried over printed circuit boards, backplanes, cables, and the like can radiate electromagnetic waves. These electromagnetic waves can cause electromagnetic interference (EMI), and are tightly regulated by appropriate agencies, such as the FCC. Common mode radiation from differential signals can also cause EMI. By modulating the slew rates of the rising and falling edges of the differential signal, and by applying negative feedback, symbol-rate related spurs can be spread over a wider frequency range than conventional spread spectrum clocking (SSC) techniques, and thus should generally be capable of greater EMI reduction than conventional SSC techniques.

19 Claims, 28 Drawing Sheets

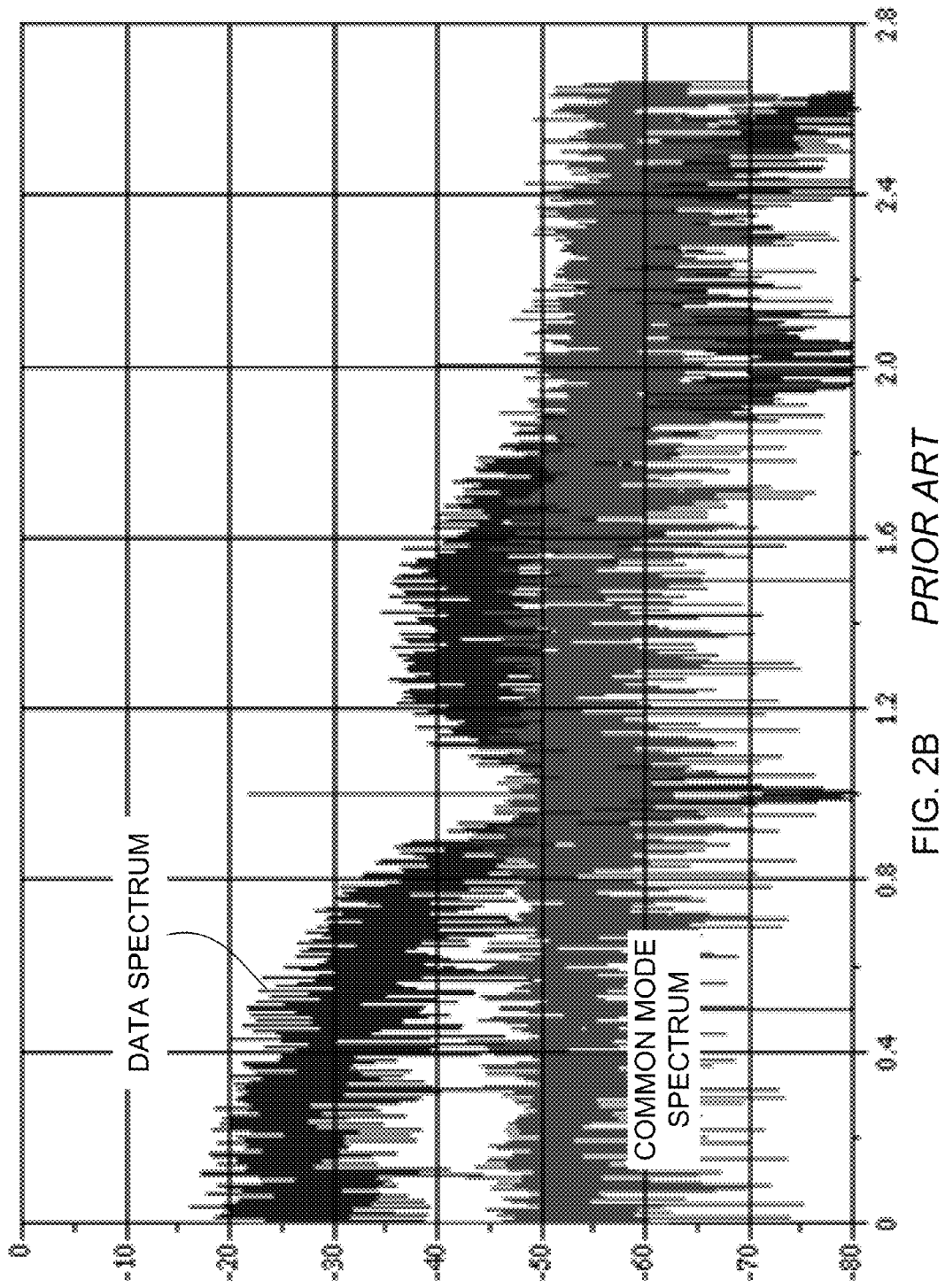
FIG. 2B  *PRIOR ART*

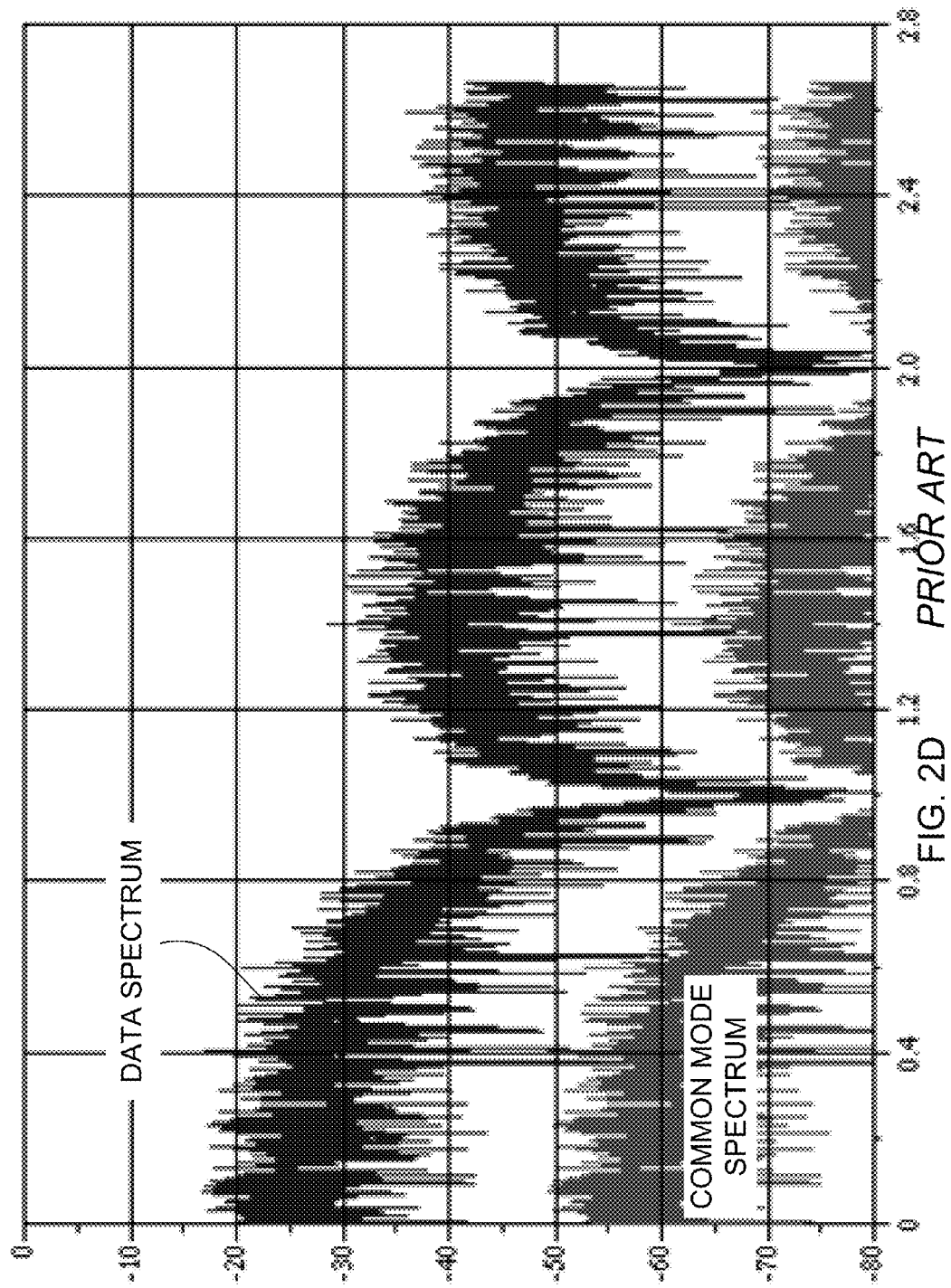
FIG. 2D  *PRIOR ART*

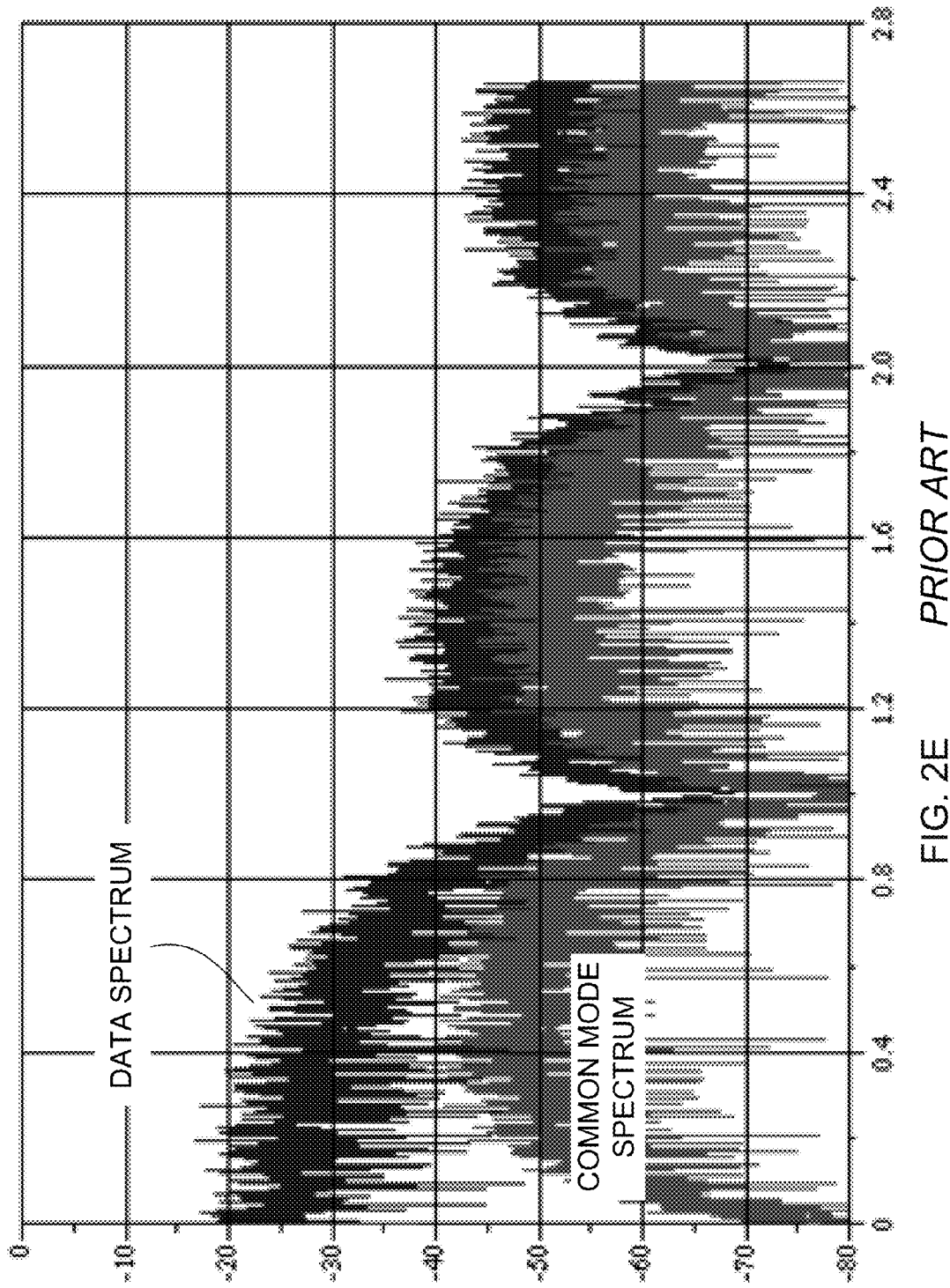
FIG. 2E  *PRIOR ART*

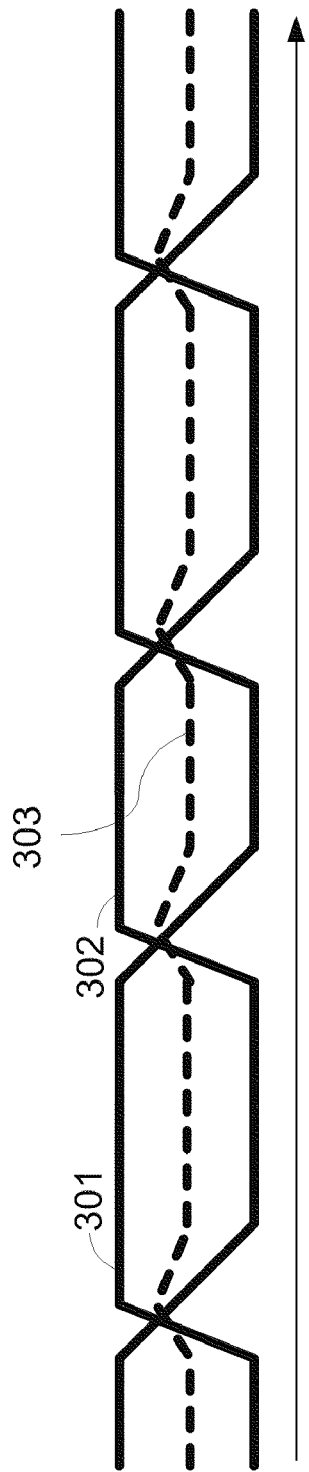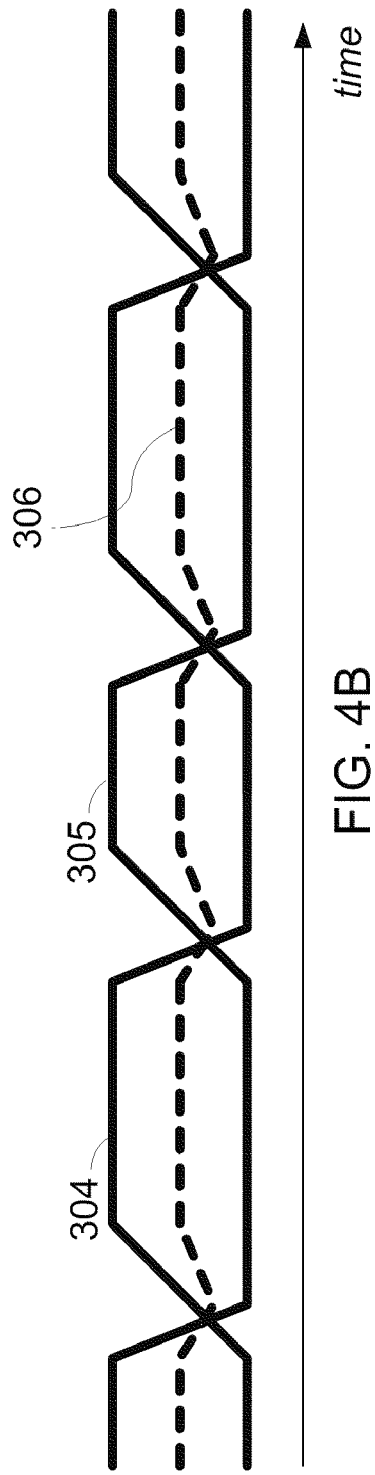
FIG. 4A PRIOR ART
FIG. 4B PRIOR ART

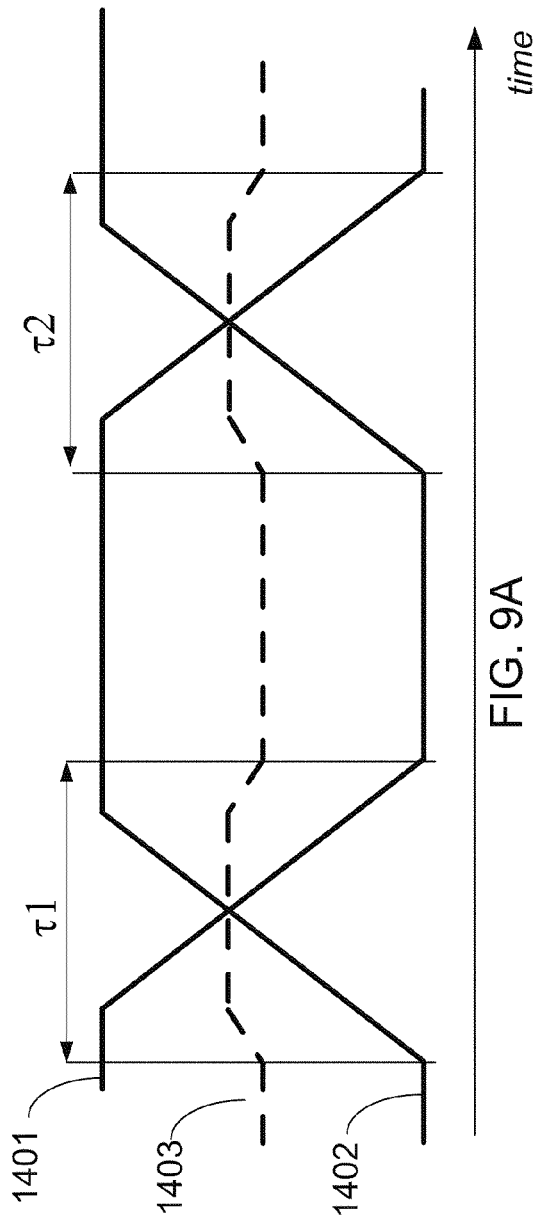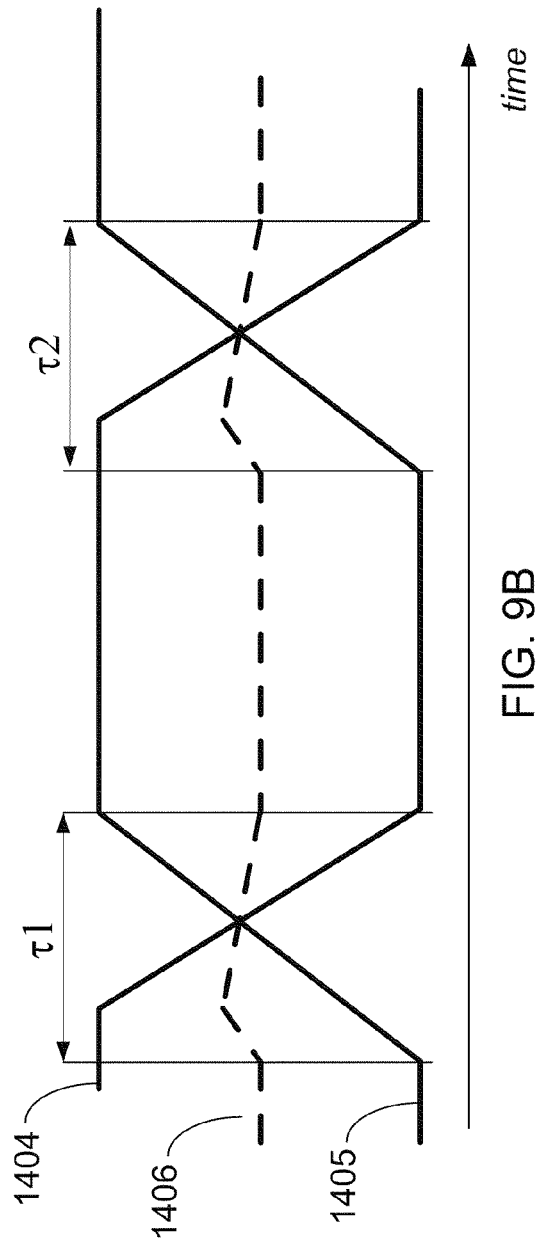

A-area > B-area+C-area

REDUCTION OF ELECTROMAGNETIC INTERFERENCE FOR DIFFERENTIAL SIGNALS

BACKGROUND

1. Field of the Invention

Embodiments of the invention generally relate to electronics, and in particular, to electronic communication sent differentially over transmission lines.

2. Description of the Related Art

Electronic devices, such as wireless devices, can be susceptible to interference from electromagnetic waves. Such interference is termed electromagnetic interference (EMI) or radio frequency interference (RFI). Electromagnetic wave emissions are typically regulated by a regulatory body, such as the Federal Communications Commission (FCC) for the U.S. and the CISPR for Europe. In addition, there can be several classes of standards for EMI compliance testing. For example, class A applies to industrial environments, class B applies to residential environments, and open-box applies to equipment, such as computer cards, which are intended to be plugged in to another unit.

EMI compliance requirements are seldom overlooked by product engineering in the specification phase, and EMI compliance is often considered only as an afterthought. EMI requirements cannot be waived. EMI compliance difficulties can lead to very expensive last minute shielding solutions or to expensive redesigns. EMI compliance requirements can also be considered beforehand, which typically results in reliance on heavy shielding that can be over designed and expensive, as there is no good tool that accurately predicts levels of EMI emissions appropriate amounts of shielding. In addition, providing shielding is not at option for open-box equipment.

Wired communications techniques offer relatively large throughput at a relatively low cost. By contrast, while optical communications via optical fibers can have a very large throughput and insignificant EMI, the cost of optical networking is relatively high. Also, while wireless communications techniques exist, the bandwidth associated with wireless communications is relatively low compared to wired communications.

In more recent times, high-speed serial data links have taken over from the prior approach, which used a parallel bus with a number of slower speed digital signals. Examples of high-speed serial interfaces currently in use are high speed USB, XAUI, Fiber-channel, Infiniband, serial ATA (SATA), serial attached SCSI (SAS), Gigabit Ethernet, SFP, XFI, and the like. These high-speed interfaces typically start from half a Gigabit per second (Gb/sec) and are now offering more than 10 Gb/sec data rates, with future information rates of over the 25 Gb/s, even 40 Gb/sec on a single high-speed input/output device (HSIO), such as a serializer/deserializer (SERDES). These interfaces use differential signal lines to carry high-speed digital data.

Differential signaling has several advantages over single-ended signaling. A differential signal is carried with two conductors to convey the signal from the transmitter to the receiver. When received at the receiver, the signal is more immune to noise as noise sources tend to affect both conductors carrying the signal in a similar fashion. While a receiver can reject the common mode signal on a pair of signal lines, radiation of the common mode signal can cause EMI.

One conventional way to reduce the radiation of the common mode signal is to apply a common mode filter. A common mode filter eliminates or reduces the common mode signal before it can be radiated by a radiator, such as the signal lines. For series branches, a common mode filter uses magnetic coupling to present a high impedance to a common mode signal and a low impedance to a differential signal. For parallel branches, a common mode filter presents a low impedance to the common mode signal and a high impedance to the differential signal. However, at high frequencies, magnetic coupling in a common mode filter is reduced, which deteriorates the differential signal.

Spread spectrum clocking (SSC) is another technique used to reduce EMI, but SSC increases jitter and is not permitted by certain communications standards. In addition, SSC does not reduce or eliminate discrete common mode frequency spurs, but rather spreads them around. A spectrum analyzer is typically used to measure EMI, and average power passing through a 1 megahertz (MHz) filter is measured. To reduce the average power measured at a particular frequency, spurs are frequency modulated to shift more than +/−0.5 MHz. A spur will then not be present constantly at a particular 1 MHz frequency bin, but will be present only for a fraction of time. The measured EMI power is thus spread over multiple bins. Therefore, SSC can still result in interference to other devices. In addition, SSC techniques complicate the recovery of the data signal, such as a complementary receiver that can lock to a modulated clock, as well as large enough data FIFOs (first in first out) memories to accommodate a large clock variation. For SSC to operate properly, the SSC modulation of the clock signal used for transmission of data should be at a relatively low frequency rate that is typically much lower than the recommended clock recovery bandwidth specified in the applicable standard. Within these limits, then the phase-locked loop (PLL) within the clock recovery circuit in the receiver should be able to follow the modulation of the SSC-modulated clock signal, and jitter of the recovered clock signal should not be increased.

Many of ordinary skill in the art had previously mistakenly believed that the source of EMI from differential signals was the high slew rates of the differential signals themselves. However, as will be shown in connection with FIGS. 1 and 2A-2E, it is the difference between the slew rates for the non-inverted (true) and inverted (false) single-ended signals of the differential signal that generates a common mode signal, which in turn, creates EMI. The non-inverted (true) and the inverted (false) signals are carried by separate electrical conductors, such as wires. Other mismatches, which also generate a common mode signal, will also be described.

Mismatches in rise and fall times are a problem for high speed SERDES transmitters. Rise time and fall time are related to slew rate. Typically, a rise time or a fall time is defined as the time it takes for a signal to rise from 10% to 90% or vice versa. The slew rate relates to the change in voltage per unit time during a rising edge or a falling edge. It should be noted that the slew rate is not constant during a transition. It is difficult to match the rise and fall times of a high-speed driver. Moreover, even when matched at a particular point, a relatively large mismatch can occur over process-voltage-temperature (PVT) variations, resulting in the generation of relatively large AC components for a common mode signal, which in turn radiates energy at the symbol rate and at multiples of the symbol rate. The current trend of operating multiple SERDES output circuits from a single chip with all the output transmitters operating off of the same clock signal, and the trend in increased symbol rate, both further increase the amount of radiated emissions.

Differential signals can radiate EMI in common mode. The common mode radiation, due to the relatively large area encircling the two signal paths carrying the differential signal and ground, can cause failures in compliance with EMI requirements. When radiating EMI, the common mode signal will typically radiate at the symbol rate and at discrete frequencies related to multiples of the symbol rate.

Several distortions of the high speed differential signals can result in common mode signals being generated. The amount of EMI depends much more on the common mode signal auto-correlation level than on the RMS level of the common mode signal as had previously been believed, and for that reason, the radiation at symbol rate frequency and multiples of the symbol rate frequencies are the most severe. FIG. 1 graphically illustrates several independent sources of common mode radiation in connection with waveforms (A) to (E). Of course, combinations of these sources of common mode radiation can be present. In FIG. 1, time is expressed along a horizontal axis, and voltage magnitude is expressed along the vertical axis for each waveform. Solid lines represent the differential signals, and dotted lines represent a resulting common mode due to distortion of the differential signals. Waveforms (A) include a resulting common mode signal due to uneven rising and falling edges from an output driver of the applicable transmitter. Waveforms (B) include a resulting common mode signal due to duty cycle distortion based on a delayed falling or rising edge. Waveforms (C) include a resulting common mode signal due to skew in the differential output signals. Waveforms (D) include a resulting common mode signal due to uneven output levels. Waveforms (E) include a resulting common mode signal due to a difference in low pass filtering between the output signals.

Waveforms (A) illustrate the effects of having uneven rise and fall times for the two differential outputs. As can be observed in waveforms (A) of FIG. 1, the common mode signal peaks have the same polarity from the steady state level. The common mode waveform depends on the distribution of transitions. This results in the alignment of spectra of each individual peak of common mode waveform so the resulting spectrum has strong components at frequencies harmonically related to the symbol rate.

Waveforms (B) illustrate the effects of duty cycle distortion due to delayed rising or falling edges. Duty cycle distortion also results in a common mode signal peaks that have the same polarity from the steady state level. This type of common mode signal results in a spectrum that has strong discrete frequency components at frequencies harmonically related to symbol rate.

Waveforms (C) illustrate the effects of skew in the output signals. In the illustrated example, one of the output signals is delayed with respect to the other due to, for example, a difference in layout. In the illustrated example, the rise and fall times are equal. The common mode waveform has peaks in both directions from the steady state level. The common mode waveform depends on the differential signal, so therefore power spectrum depends on the data signal; however there are typically no dangerous strong discrete frequency components if the data is random or scrambled.

Waveforms (D) illustrate the effects of the two output signals that are not equal in amplitude. The resulting common mode waveform is an attenuated replica of the differential signal waveform, and therefore there are potentially dangerous discrete frequency components in the spectrum even if the data is random or scrambled.

Waveforms (E) illustrated the effects of one of the differential output signals being filtered more than the other. The imbalance in filtering generates a common mode waveform that depends on the data; however, there are typically no dangerous discrete frequency components in the spectrum if the data is random or scramble.

FIGS. 2A-2E illustrate simulated power spectrums for examples of differential signals the common mode corresponding to waveforms (A) to (E) of FIG. 1. Frequency normalized to the symbol rate is expressed along the horizontal axis. Power in decibels is expressed along a vertical axis. FIGS. 2A-2E illustrate a simulated power spectrum for data and a corresponding common mode given the distortions described earlier in connection with waveforms (A) to (E) of FIG. 1, respectively. In addition, for the case illustrated in connection with FIG. 2A, the common mode has a first spur at −28 decibels relative to the carrier (dBc) and a second spur at −31 dBc. For the case illustrated in connection with FIG. 2A, the common mode has a first spur at −21 dBc and a second spur at −25 dBc.

As illustrated by the various power spectrums of FIGS. 2A-2E, not all types of distortion lead to EMI problems. The worst EMI offenders are typically discrete frequencies (frequency spurs) that rise above other frequencies. Thus, typically, the most dangerous distortions are ones for which peaks from the steady-state common mode value depend on the position of the transition. These distortions are the duty cycle distortion (DCD), which is depicted by waveform (B) of FIG. 1, and the distortion due to uneven rise and fall times depicted by waveform (A) of FIG. 1.

FIG. 3 illustrates coupled inductors for common mode filtering via a common mode choke configuration. The operation of the common mode choke is explained in connection with Equations 1-5. For the common mode choke, the amount of inductance for the inductors $L_1$, $L_2$ should be about the same and is represented by "L" from Equation 3 onwards.

$$V_1 = L_1 \cdot \frac{dI_1}{dt} + M \cdot \frac{dI_2}{dt} \quad \text{(Eq. 1)}$$

$$V_2 = M \cdot \frac{dI_1}{dt} + L_2 \cdot \frac{dI_2}{dt} \quad \text{(Eq. 2)}$$

$$M = k \cdot \sqrt{L_1 \cdot L_2} = k \cdot L \quad \text{(Eq. 3)}$$

$$V_1 = (1+k) \cdot L \cdot \frac{dI_1}{dt} \quad \text{(Eq. 4)}$$

$$V_2 = (1+k) \cdot L \cdot \frac{dI_2}{dt} \quad \text{(Eq. 5)}$$

For differential signals, with $I_1 = -I_2$, the value of the coupling coefficient k is negative. With very tight coupling k=−1, there is virtually no voltage drop on common mode choke for a differential signal. For the common mode, $I_1 = I_2$ and tight coupling k≈1, so the common mode is attenuated. If the coupling is not very tight, then not only is the common mode not well attenuated, but the differential mode becomes attenuated. For high speed data communication, such as data rates in the range of 10 GHz, the common mode chokes are typically made with bifilar windings wound around a ferrite bead. For these conventional common mode chokes, the absolute value of the coupling factor k is typically in the range between 0.7 and 0.9, which results in a substantial amount of attenuation for the differential mode. In addition, the parasitic capacitance between the windings can cause attenuation of the high frequency components of the signal. The parasitic capacitance across the separate windings can also cause problems. Thus, conventional common mode chokes are typically not useful above about 5 GHz, and the compound use of common mode chokes of high-low-high impedance such as described in U.S. Pat. No. 5,077,543 to Carlile, can become unusable at lower frequencies.

The filtering of common mode spurs on a printed circuit board (PCB) before the signal reaches an effective antenna is another conventional technique. However, the technique is very dependent upon the particular PCB, requires specialized expertise, and can still lead to multiple PCB iterations.

FIGS. 4A and 4B illustrate two cases of different rise and fall slew rates generating a type of common mode signal that has peaks from the steady-state level only in one direction. That type of common mode signal does not depend on the data values, but generates common-mode energy upon transitions with high spurious contents at the symbol rate and multiples of the symbol rate.

FIGS. 4A and 4B illustrate waveforms of pairs of single-ended signals forming differential signals with unbalanced slew rates. In both FIGS. 4A and 4B, voltage is expressed along a vertical axis and time is expressed along a horizontal axis. FIG. 4A illustrates a non-inverted signal 301 and an inverted signal 302 for a differential signal. In the example of FIG. 4A, the non-inverted signal 301 has a higher slew rate for a rising edge than for a falling edge. The inverted signal 302 also has a higher slew rate for a rising edge than for a falling edge. These mismatches in slew rates generate a common mode signal 303 that has only positive pulses (positive peaks above the steady-state level). FIG. 4B illustrates a non-inverted signal 304 that has higher falling edge slew rate than a rising edge slew rate. An inverted signal 305 also has a higher falling edge slew rate than the slew rate of the rising edge. These mismatches generate a common mode signal 306 that has only negative pulses (negative peaks below the steady-state level). The foregoing examples show that common mode signals 303, 306, produced by non-linear common mode generation (FIG. 1, case A and B), result in deterministic waveforms during the transition intervals independent of the randomness of signal data. No matter how much case is placed during design, it will not be possible to prevent common mode signal noise from appearing at boundaries of symbol intervals during the data transition from one state to another. Especially damaging is a resulting common mode signal that is deterministic in nature and repeats at symbol interval boundaries during transitions. The deterministic nature of a common mode signal waveform during transitions causes strong auto-correlation function periodicity at the symbol interval and multiples of the symbol interval, which in turn produces spurs at the symbol rate frequency and multiples of the symbol rate.

SUMMARY OF THE DISCLOSURE

The invention includes an apparatus and method for the modulation of the slew rate of high-speed edges of a differential digital signal. One embodiment can reduce the value of common mode signal auto-correlation function appearing at the symbol interval and multiples of the symbol interval by randomizing the common mode signal. High-speed digital signals that are carried over printed circuit boards, back-planes, cables, and the like can radiate electromagnetic waves. These electromagnetic waves can cause electromagnetic interference (EMI), and are tightly regulated by appropriate agencies, such as the FCC. Common mode radiation from differential signals is a source of EMI. By modulating the slew rates of the rising and falling edges of the differential signal, and by applying negative feedback, symbol-rate related spurs can be spread over a wider frequency range than conventional spread spectrum clocking (SSC) techniques, and thus should generally be capable of greater EMI reduction than conventional SSC techniques. In addition, the peak-to-average radiation limit is about 20 dB, which sets forth a limit on the ability of SSC to reduce EMI. Further, some standards to not permit SSC to be used.

Typically, electronic products need to pass one or more EMI requirements set forth by different government bodies. It can be cost prohibitive to modify products to pass EMI tests.

Embodiments of the invention can reduce actual spur levels by enabling better matching of rising edges and falling edges of differential signals. Further, spurs that remain can be spread by randomly switching relatively well-matched rising and falling edge rates such that corresponding frequency spurs are partially canceled and/or spread out in frequency wider than 1 MHz. Moreover, the disclosed techniques can be implemented without adding jitter to the differential signals.

Embodiments of the invention are effective to modulate the common mode signal generated from mismatches of a differential signal, without modulating important characteristics of the differential signal, which can otherwise lead to jitter. One embodiment does not spread the desired differential signal as do SSC techniques, but only spreads out the common mode signal. Since the differential signal is largely unaffected, the spreading of the common mode signal is not as limited by jitter concerns.

In addition, frequency spurs can be reduced by spread spectrum techniques. A common mode signal can be generated such that spurs have opposite sign, which can result in an average that is zero. In one embodiment, rather than or in addition to minimizing the generation of common mode related spurs, mismatches of opposite sigh are intentionally permitted and spread out over time randomly. This can divide the power of the EMI over many smaller frequency components. The randomness of the modulation process is preferable because it spreads the common mode signal spectral components relatively evenly.

BRIEF DESCRIPTION OF THE DRAWINGS

These drawings and the associated description herein are provided to illustrate specific embodiments of the invention and are not intended to be limiting.

FIGS. 2A-2E illustrates corresponding power spectrums of data signals and common mode signals produced by the distortions illustrated in FIG. 1.

FIGS. 4A and 4B illustrates waveforms of a pair of single-ended signals that form a differential signal with mismatches in slew rates.

FIGS. 9A and 9B illustrate the effect that a relative delay between the non-inverted signal and the inverted signal has on the common mode signal and thus EMI.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art. Embodiments can be implemented with electronic hardware, such as on a solid state integrated circuit.

Returning now to the waveforms illustrated in FIGS. 4A and 4B, EMI can be reduced if the EMI power concentrated at the symbol rate and multiples of the symbol rate can be spread. Spreading of the spectrum can be achieved by randomizing the common mode signal waveform. The randomization can be achieved in a number of ways. As discussed earlier, the common mode signals 303, 306 in FIG. 4 are deterministic, that is, they do not depend on the data value of the differential signal, but rather, the variations in the common mode signals 303, 306 occur when there is a transition from either 1 to 0 or from 0 to 1. The common mode signal 303 has all positive signal peaks, and the common mode signal 306 has all negative signal peaks.

One embodiment changes the common mode signals 303, 306 such that the signal peaks are present in both directions, which reduces the level of the discrete frequency spur that occurs at the data rate.

Figure 1:
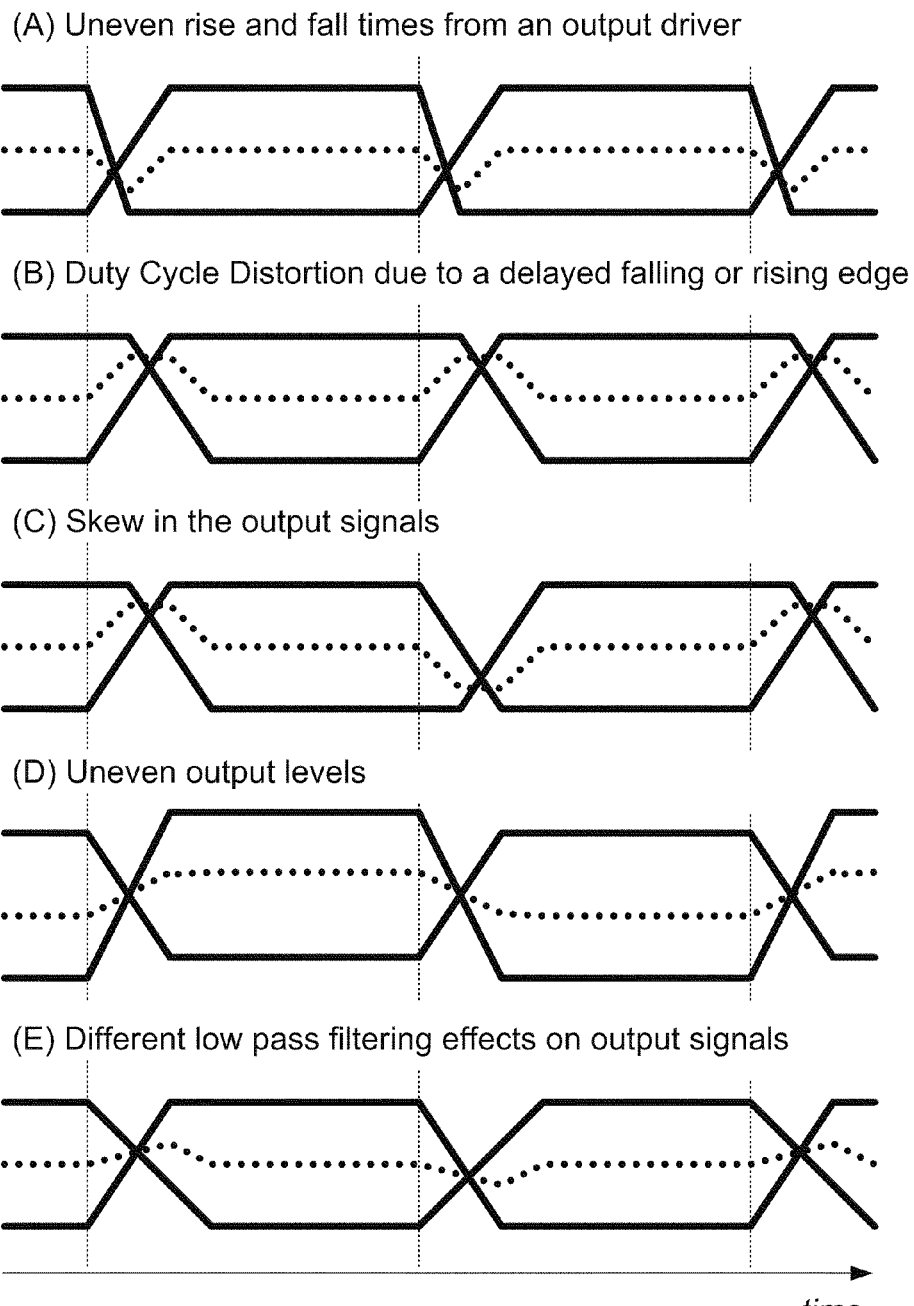
FIG. 1 illustrates waveforms of pairs of single-ended signals that form differential signals and examples of distortions of waveforms that can cause common mode noise.
Figure 2A:
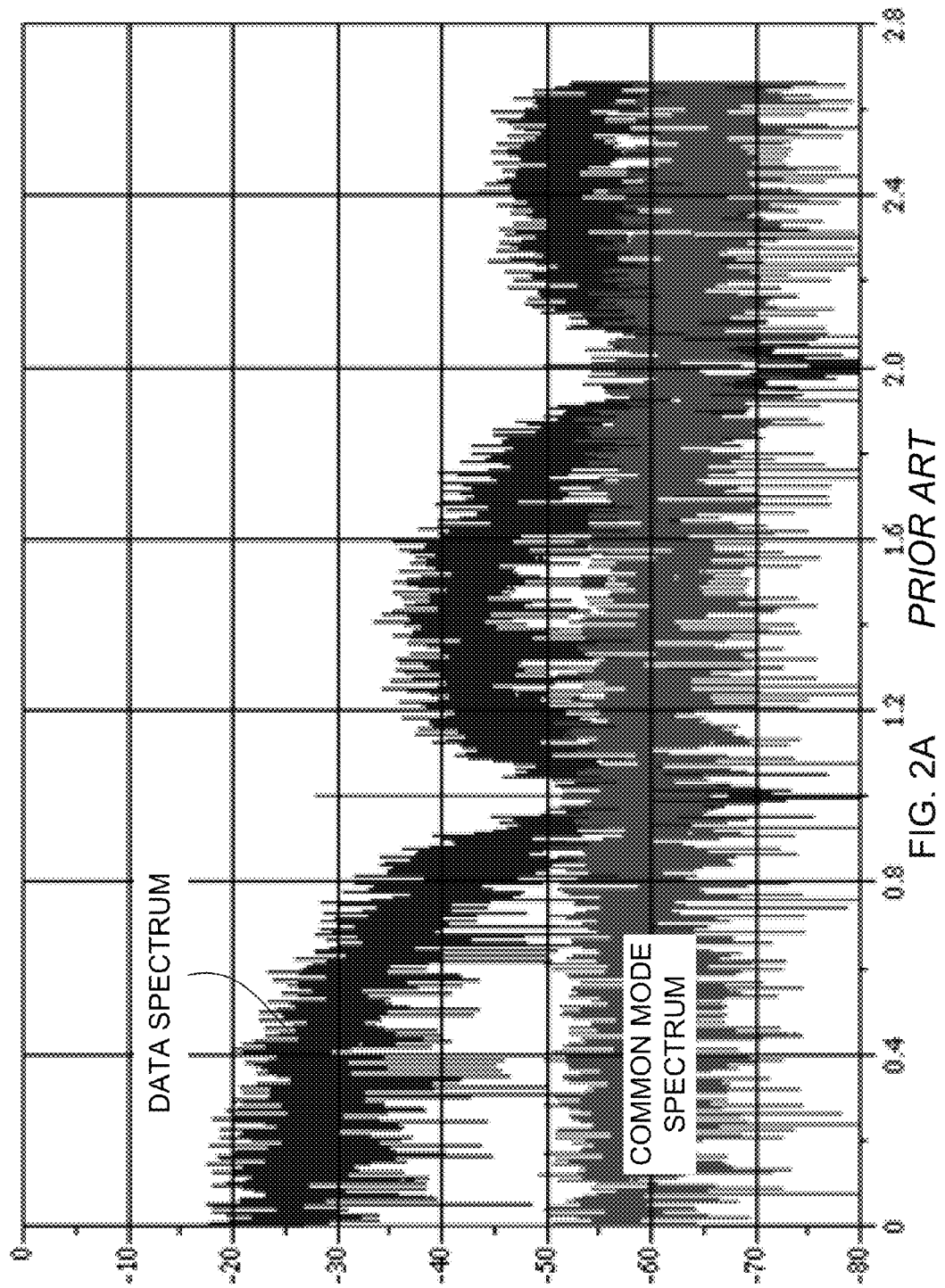
Figure 2C:
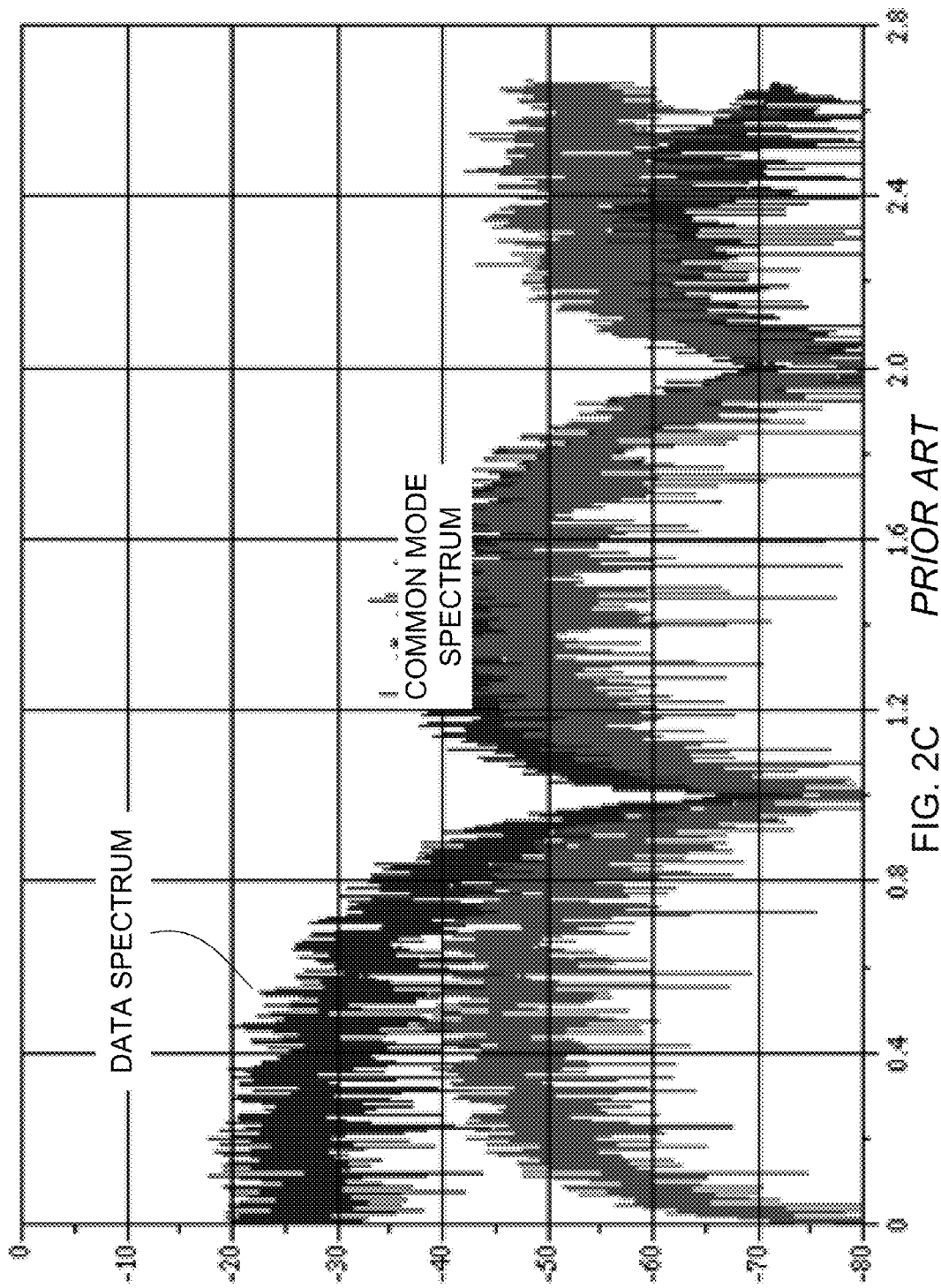
Figure 3:
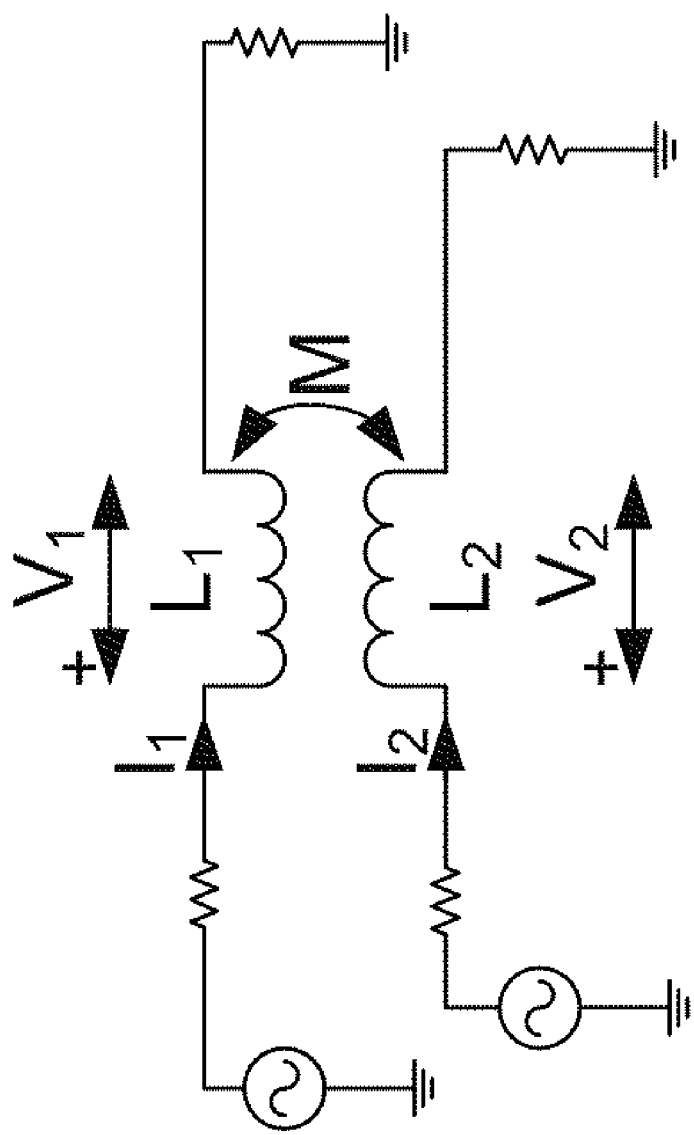
FIG. 3 illustrates a conventional common mode choke.
Figure 5:
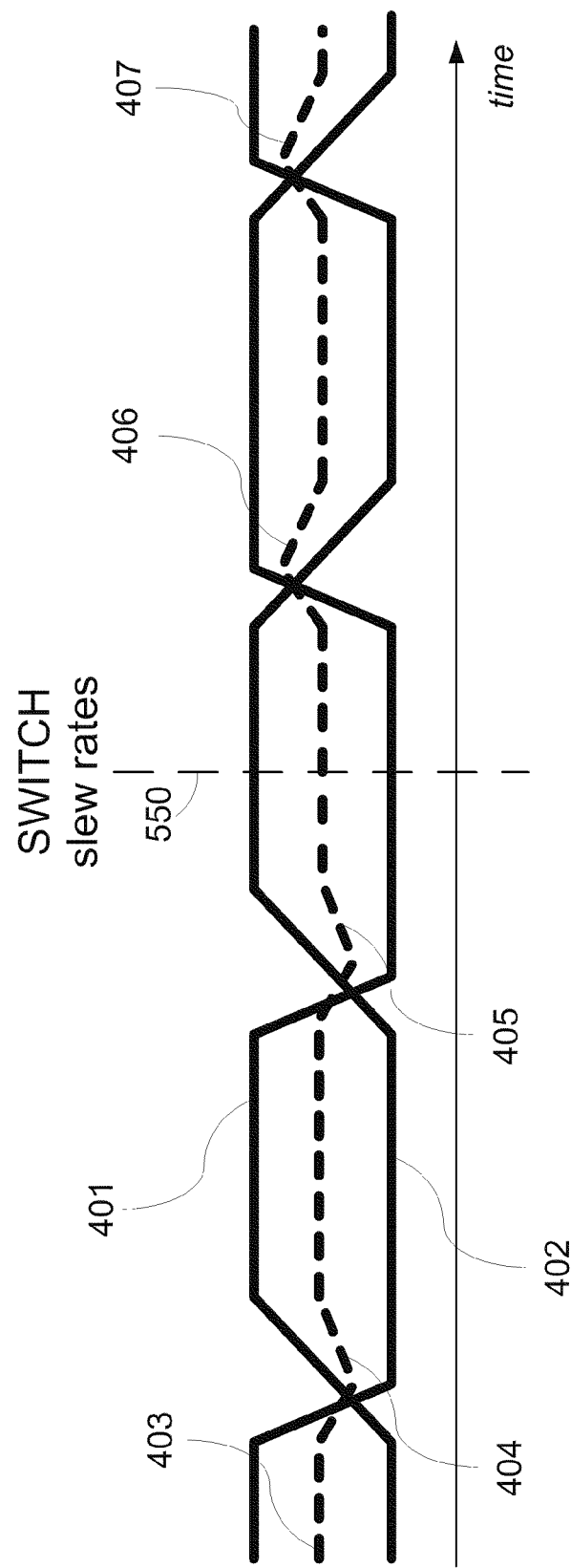
FIG. 5 illustrates waveforms of a pair of single-ended signals that form a differential signal with switchable rising and falling edge slew rates.

FIG. 5 illustrates waveforms of a pair of single-ended signals forming a differential signal with switchable rising and falling edge slew rates. The differential signal is the difference between a non-inverted signal 401 and an inverted signal 402, both of which are represented by solid lines. A dashed line indicates the common mode signal 403. A dashed line 550 represents a time in which the slew rates are switched. To the left of the dashed line 550, the slew rate for a rising edge is lower than the slew rate for a falling edge, which results in the common mode signal 403 having negative signal peaks 404, 405. After switching, as indicated by the dashed line 550, the slew rate for the rising edge is higher than the slew rate for the falling edge, and the signal peaks 406, 407 of the common mode signal 403 become positive.

Figure 6A:
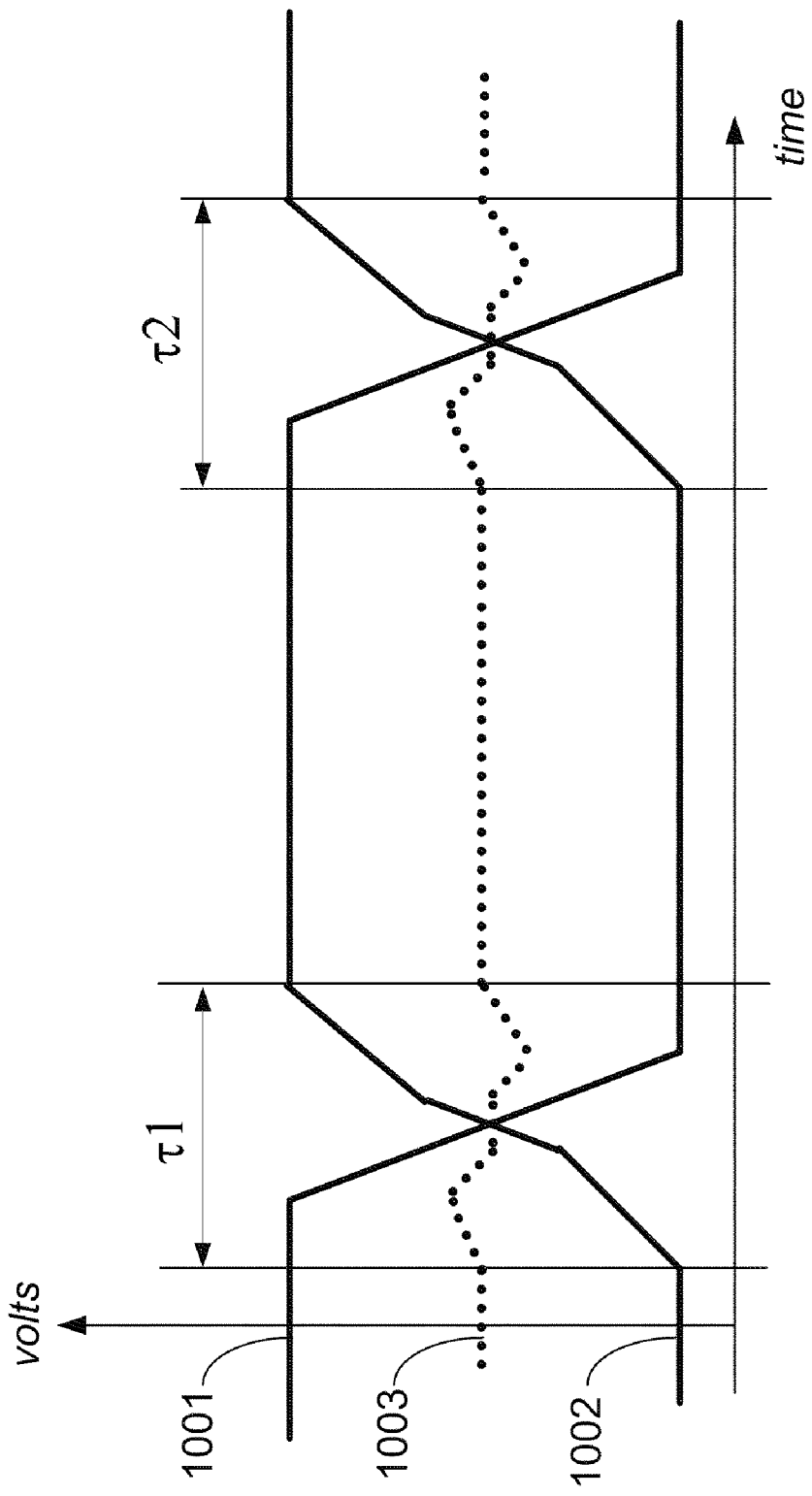
FIG. 6A illustrates a pair of single-ended signals forming a differential signal and a resulting common mode signal for transitions without edge modulation.

FIG. 6A illustrates a pair of single-ended signals forming a differential signal and a resulting common mode signal 1003 for transitions without edge modulation. Time is expressed along a horizontal axis, and voltage is expressed along a vertical axis. It can be difficult to match the slew rates for rising edges and for falling edges. It is typically not sufficient to match the slew rate at only a point in the transition. Rather, the slew rate should be matched throughout the transition period. Without edge modulation, it can be difficult to achieve matching of the slew rates throughout the transition period. FIG. 6A illustrates waveforms for a non-inverted signal 1001 and an inverted signal 1002 that form a differential signal, wherein the non-inverted signal 1001 and the inverted signal 1002 have matching slew rates in the middle of transition periods τ1 and τ2. The slew rates are not matched at the ends of the transition periods τ1 and τ2. As illustrated in FIG. 6A, the slew rate for the rising edge is initially greater in the transition periods τ1 and τ2 than the slew rate for the falling edge. As illustrated in FIG. 6A, later in the transition periods τ1 and τ2, the slew rate for the falling edge is greater than the slew rate for the rising edge. These differences in slew rates within the transition periods τ1 and τ2 give rise to a common mode signal 1003 with both positive and negative signal peaks during these transition periods τ1 and τ2. The foregoing illustrates that even if the slew rates are matched along a point in the transition, relatively large EMI can emanate from the common mode signal 1003 due to signal peaks that cause frequency spurs at the data rate. While the common mode signal 1003 has positive and negative peaks, the common mode signal 1003 is still deterministic in waveform during transition intervals, and therefore will have relatively strong auto-correlation function peaks at multiples of the symbol interval, which ultimately causes spurs.

Figure 6B:
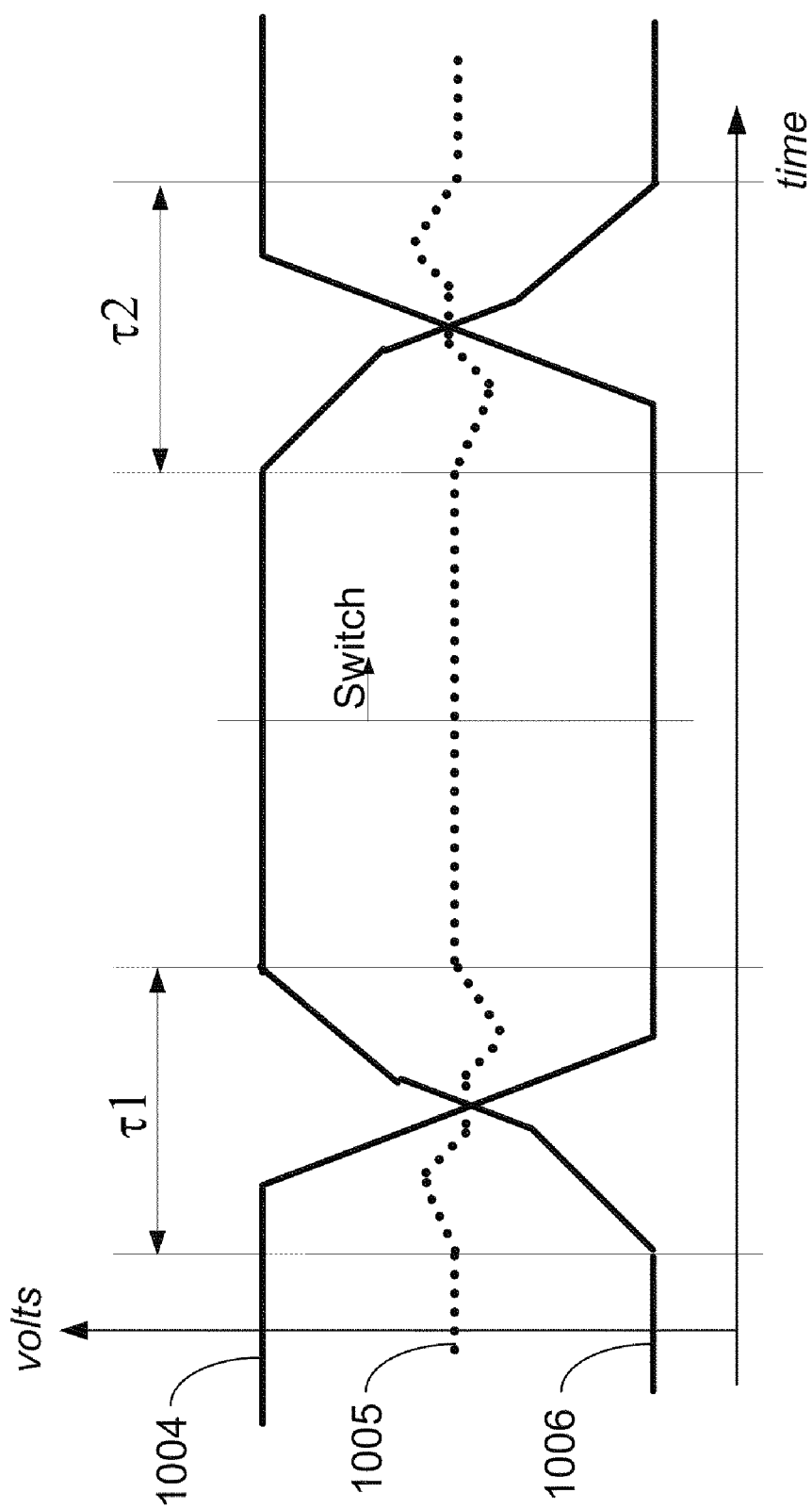
FIG. 6B illustrates a pair of single-ended signals forming a differential signal and a resulting common mode signal for transitions with edge modulation.

FIG. 6B illustrates a non-inverted signal 1004 and an inverted signal 1006 that form a differential signal, and a resulting common mode signal 1005 for transitions with edge modulation. Time is expressed along a horizontal axis, and voltage is expressed along a vertical axis. The transitions or edges are modulated such that in the first transition period τ1, the slew rate for the rising edge is greater than the slew rate for the falling edge, and in the second transition period τ2, the slew rate for the falling edge is greater than the slew rate for the rising edge. The resulting common mode signal 1005 has signal peaks that are of opposite phase in τ1 and τ2.

The opposing phases of the common mode signal 1005 for transition period τ1 versus transition period τ2 causes the corresponding discrete spurs to have opposite signs. The cumulative spurs can be considered to be a superposition of spurs of two cases. The first case spurs are spurs generated by the common mode signal waveforms that have same shape as 1006 during period transition period τ1. The second case spurs are spurs generated by common mode signal waveforms that have same shape as 1006 during period τ2. The two case spurs may not be the same magnitude as the edges during transition interval τ1 and transition interval τ2 will typically not be precise inverses of each other as will be discussed later in connection with FIG. 7. In one embodiment, edge modulation is applied in an uneven manner such that there are more instances of first case spurs than second case spurs or vice versa to compensate for unequal characteristics between first case spurs and second case spurs.

Figure 7:
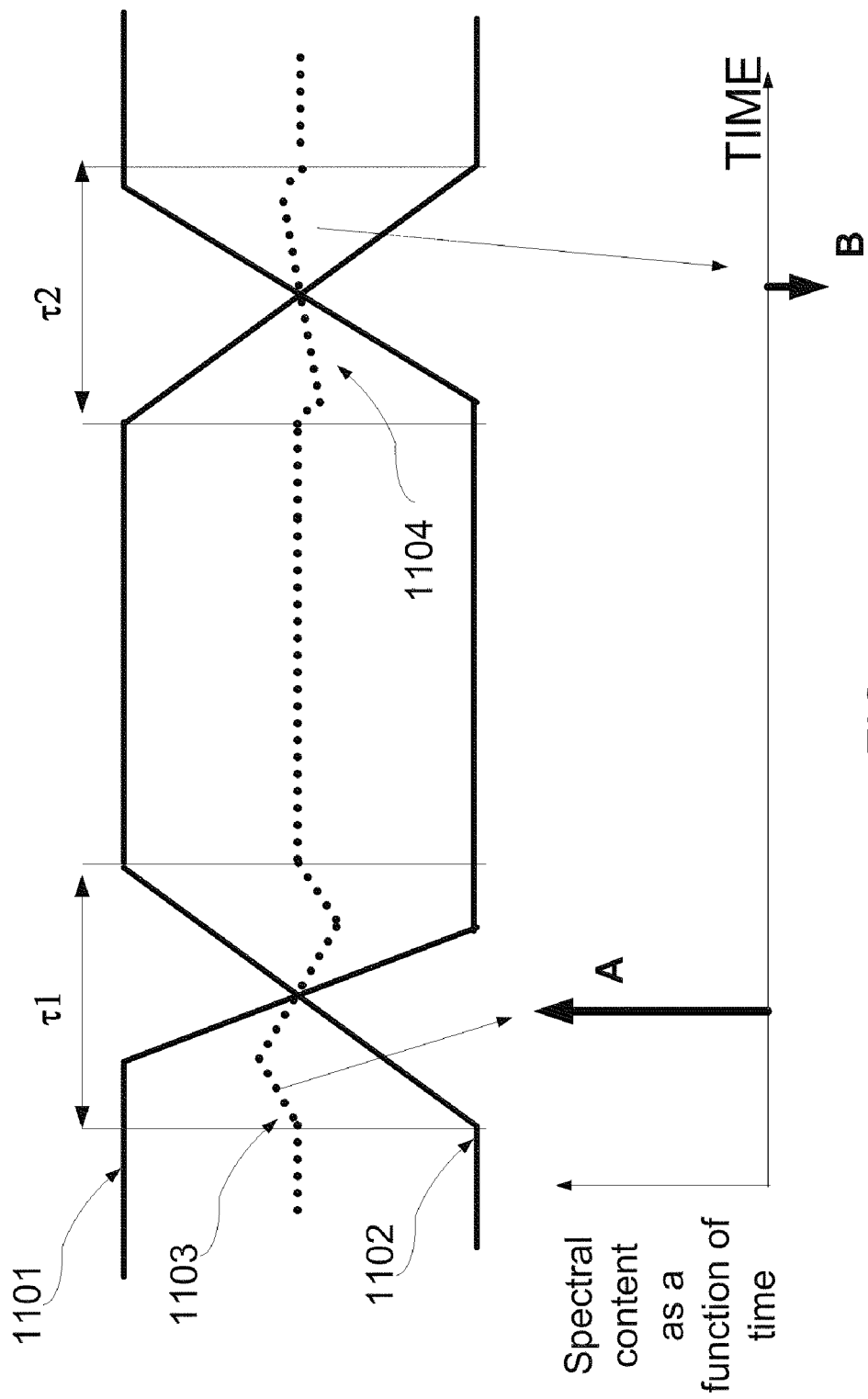
FIG. 7 illustrates a pair of single-ended signals forming a differential signal and a resulting common mode signal for transitions within edge modulation, wherein the edge modulation is uneven.

FIG. 7 illustrates a non-inverted signal 1101 and an inverted signal 1102 that form a differential signal, and a resulting common mode signal 1105. While there is edge modulation present, such that signal peaks 1103, 1104 in transition intervals τ1, τ2 are opposite in phase with respect to each other, the signal peaks are unequal in magnitude. Signal peak 1103 has greater magnitude than signal peak 1104, which demonstrates a practical example of edge modulation. Signal peak 1103 generates a spur component represented with magnitude "A" as labeled in FIG. 7. Signal peak 1104 generates a spur component represented with magnitude "B" as labeled in FIG. 7. The spur with magnitude "B" has a smaller magnitude and is out of phase with respect to the spur with magnitude "A." In one embodiment, more complete spur cancellation can be obtained if, on average, edge modulation is applied N1 times that produces common mode signal peaks 1103 and edge modulation is applied N2 times that produces common mode signal peaks 1104 to account for the unequal magnitudes. Relatively good spur cancellation can be achieved when the relationship expressed in Equation 6 is followed:

$$A \cdot N1 = B \cdot N2 \qquad \text{(Eq. 6)}$$

Figure 8:
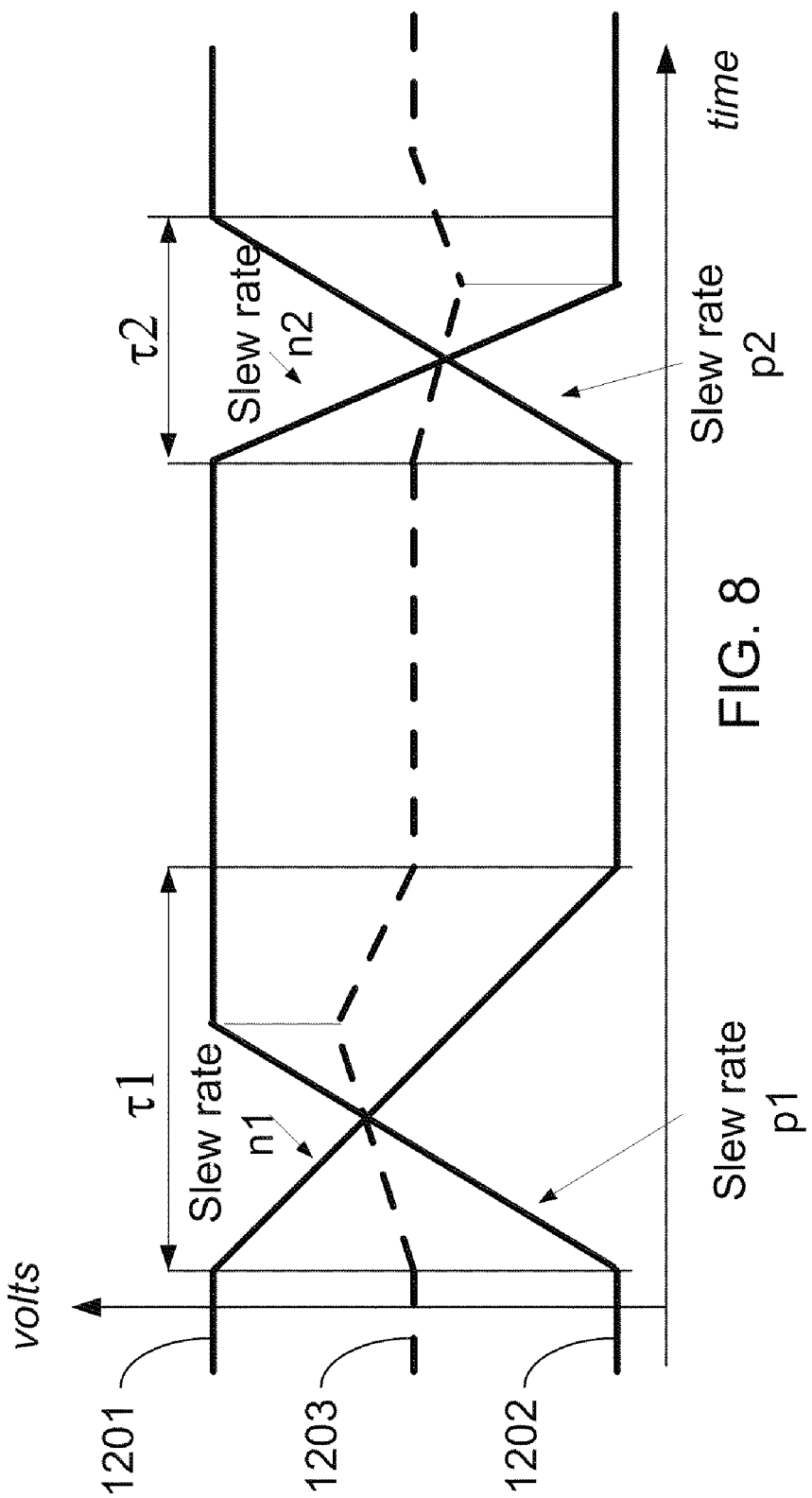
FIG. 8 illustrates modulation of a slew rate of just one of a rising or falling edge for common mode signal peak reduction for reduced EMI.

FIG. 8 illustrates modulation of a slew rate of just one of a rising edge or falling edge for common mode signal peak reduction for reduced EMI. FIG. 8 illustrates a non-inverted signal 1201 and an inverted signal 1202 that form a differential signal, and a resulting common mode signal 1203. Time is expressed along a horizontal axis. Voltage is expressed along a vertical axis. In the illustrated example, the slew rate for the rising edges remains the same, and the slew rate for the falling edges is modulated. In a time period τ1, the slew rate of the falling edge of the non-inverted signal 1201 is relatively low. In a time period τ2, the slew rate of the falling edge of the inverted signal 1202 is relatively high. Techniques to switch slew rates will be described later in connection with FIGS. 11-16. FIG. 8 illustrates a principal that a frequency spur can be reduced without modulation of both rising edges and the falling edges. In the illustrated example, only the falling edges are modulated. However, when modulation of the slew rate of only one of the rising edges or the falling edges is performed, the timing of the crossings of the non-inverted signal 1201 and the inverted signal 1202 will change, which can result in increased jitter.

When slew rates for both the rising and falling edges are modulated, it is possible to change the individual slew rates for the non-inverted signal and the inverted signal of the differential signal and yet keep the differential slew rate relatively unchanged. The differential slew rate is the sum of the slew rates of the non-inverted signal and the inverted signal. For example, the slew rate of the non-inverted signal can be reduced by the same amount as the slew rate of the inverted signal is increased, or vice-versa. When the differential slew rate is not changed from transition to transition, jitter should not increase.

FIGS. 9A and 9B illustrate the effect that a relative delay between the non-inverted signal and the inverted signal has on the common mode signal and thus EMI. FIG. 9A illustrates an example in which the rising edges and the falling edges of both a non-inverted signal 1401 and an inverted signal 1402 of a differential signal have the same slew rate, but are offset from each other with respect to time. A resulting common mode signal 1403 is also drawn. FIG. 9B illustrates an example in which the falling edge slew rates for a non-inverted signal 1404 and an inverted signal 1405 of a differential signal are greater than the rising edge slew rates. The rising edges and the falling edges are also offset from each other with respect to time. A resulting common mode signal 1406 is also drawn. As illustrated by the common mode signals 1403, 1406 FIGS. 9A and 9B, the delay of an edge relative to the other edge results in relatively low signal peaks for unequal slew rates for rising and falling edges.

Figure 10A:
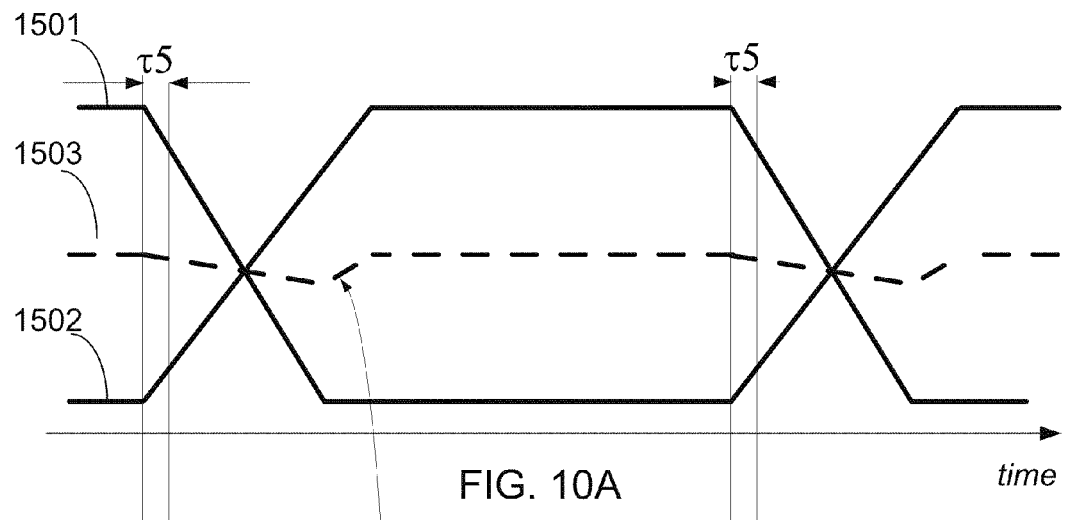
FIGS. 10A and 10B illustrate reducing EMI by using a static delay.
Figure 10B:
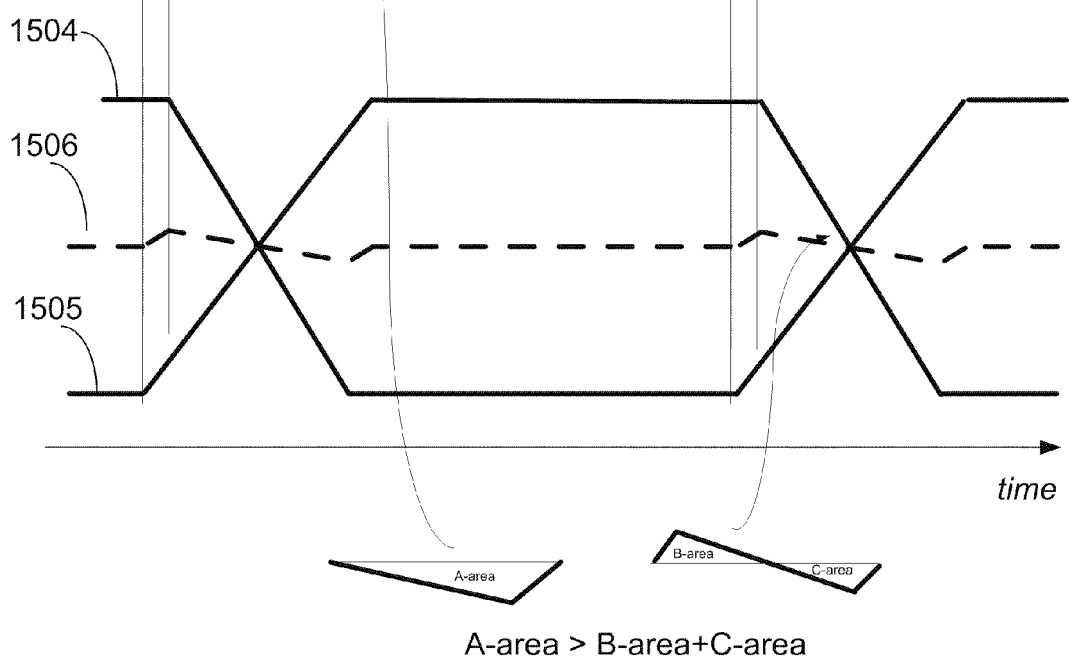

FIGS. 10A and 10B illustrate reducing EMI by using a static delay to control relative timing between a non-inverted signal and an inverted signal of a differential signal. The introduction of a static delay can partially compensate for the effects of mismatches in slew rates of rising edges and falling edges. However, this timing-based solution reduces to the common mode signal 1003 of FIG. 6A, and edge modulation is typically a superior solution. FIG. 10A illustrates an example without delay, in which the slew rate for the falling edge is higher than the slew rate for the rising edge. The common mode signal 1503 disturbance can be represented but A-area. FIG. 10B the non-inverted signal 1504 is delayed by an amount τ5. The resulting common mode signal 1506 results in disturbances B-area and C-area. The A-area is always larger than the sum of the B-area and the C-area, but static modulation is not as effective as dynamic modulation of edges. If the relationship expressed in Equation 7 is followed, the energy for the spur will be at a local minimum but not at a minimum minimorum.

$$B\_area = C\_area \qquad \text{(Eq. 7)}$$

FIGS. 11-16 illustrate techniques for modifying slew rates for rising edges and/or falling edges. Output transmitters can selectively switch between two or more slew rates. There are many ways to modify slew rates for rising edges and/or falling edges, and there are also many ways to select between multiple slew rates. In addition, a variety of techniques can be used to modulate the slew rates such that the relationship expressed earlier in Equation 6 is followed.

Many different signals can be used to control the modulation between the two of more slew rates. For example, a Pseudo Random Binary Sequence (PRBS) or other signal in open loop operation can be used. A PRBS switching sequence randomizes the appearance of faster rise or fall slew rate edges, resulting in positive and negative variations for the common mode signal. Randomizing the common mode signal waveform effectively results in spreading the spurious response and reducing spur levels as discussed earlier in connection with FIG. 7 with spur components "A" and "B." The rate at which the switching is performed determines the amount of spreading and the distribution of spur components "A" and "B." However, the use of a signal, such as a PRBS signal, in open loop is not assured of modulating the spur components "A" and "B" in a manner that would satisfy Equation 6, so the open loop configuration, while simple, should not cancel EMI as effectively as a closed loop solution that could be configured to satisfy Equation 6.

While illustrated in the context of high-speed digital signal transmitters based on two CMOS drivers, the principles and advantages disclosed herein are applicable to other forms of differential drivers, such as, but not limited to, differential transistor-to-transistor logic (DTTL), differential emitter coupled logic (DECL), low-voltage differential signaling (LVDS), and the like. The CMOS driver configuration is typically driven by a pair of complementary input signals.

Figure 11A:
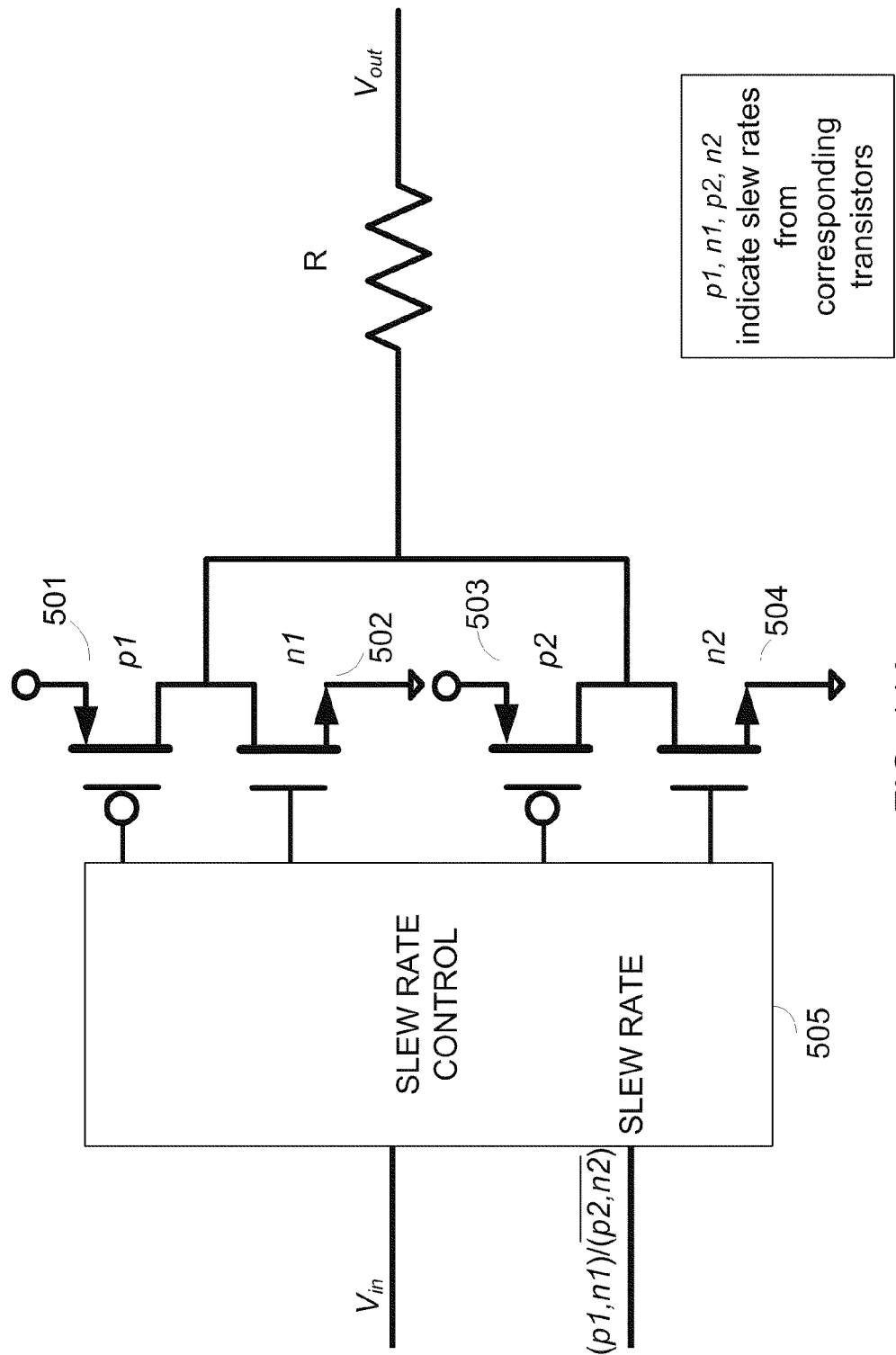
FIG. 11A illustrates a pair of CMOS drivers that can be used to implement edge modulation.

The circuit of FIG. 11A illustrates basic principles of an embodiment of the invention. In the illustrated circuit, $V_{out}$ is inverted with respect to $V_{in}$. Also, it should be noted that for a differential circuit, one circuit is needed for the non-inverted signal, and a second circuit is needed for the inverted signal. A first CMOS driver subcircuit includes a PMOS transistor 501 and an NMOS transistor 502. A second CMOS driver subcircuit includes a PMOS transistor 503 and an NMOS transistor 504. In the illustrated embodiments of FIGS. 11A-11C, one of the two driver subcircuits can be selected with a slew rate control circuit 505 for activation as the driver, while the unselected driver subcircuit goes to a high-impedance state. When the first CMOS driver subcircuit 501, 502 is selected, the PMOS transistor 501 pulls the $V_{out}$ node high at a p1 slew rate, and the NMOS transistor 502 pulls the $V_{out}$ node low at an n1 slew rate, the output state depending upon the state of the input $V_{in}$. Similarly, when the second CMOS driver subcircuit 503, 504 is selected, the PMOS transistor 503 pulls the $V_{out}$ node high at a p2 slew rate, and the NMOS transistor 504 pulls the $V_{out}$ node low at an n2 slew rate, the output state depending upon the state of the input $V_{in}$. In the illustrated example, the slew rate can be selected by setting the control signal (p1,n1)/$\overline{(p2,n2)}$ high or low. When the control signal (p1,n1)/$\overline{(p2,n2)}$ is high, the first CMOS driver subcircuit 501, 502 is active, and when the control signal (p1,n1)/$\overline{(p2,n2)}$ is low, the second CMOS driver subcircuit 503, 504 is active. In contrast to, for example, data busses in which 3-state logic can be found, in the illustrated embodiment, there should be at least one CMOS driver subcircuit selected at a time so that the output driver as a whole should not go into a high impedance state except possibly momentarily while switching slew rates. In other embodiments to be described later, at least one driver of two or more paralleled drivers is always active.

Although it is not possible for a CMOS driver subcircuit to have characteristics such that the slew rate p1 equals the slew rate n1 or such that the slew rate p2 equals the slew rate n2 under all process, voltage, and temperature (PVT) variations, it is possible for the two CMOS driver subcircuits to have a slew rate p1 greater than the slew rate n1, and the slew rate p2 less than the slew rate n2. So, the first CMOS driver subcircuit can intentionally have a slightly faster rising slew rate p1 than the falling slew rate n1, while the second CMOS driver subcircuit can intentionally have a faster falling slew rate n2 than a rising slew rate p2. Repeatedly switching between the first CMOS driver subcircuit and the second CMOS driver subcircuit has the effect of sometimes having a faster slew rate for a rising edge and sometimes having a faster slew rate for a falling edge.

Figure 11B:
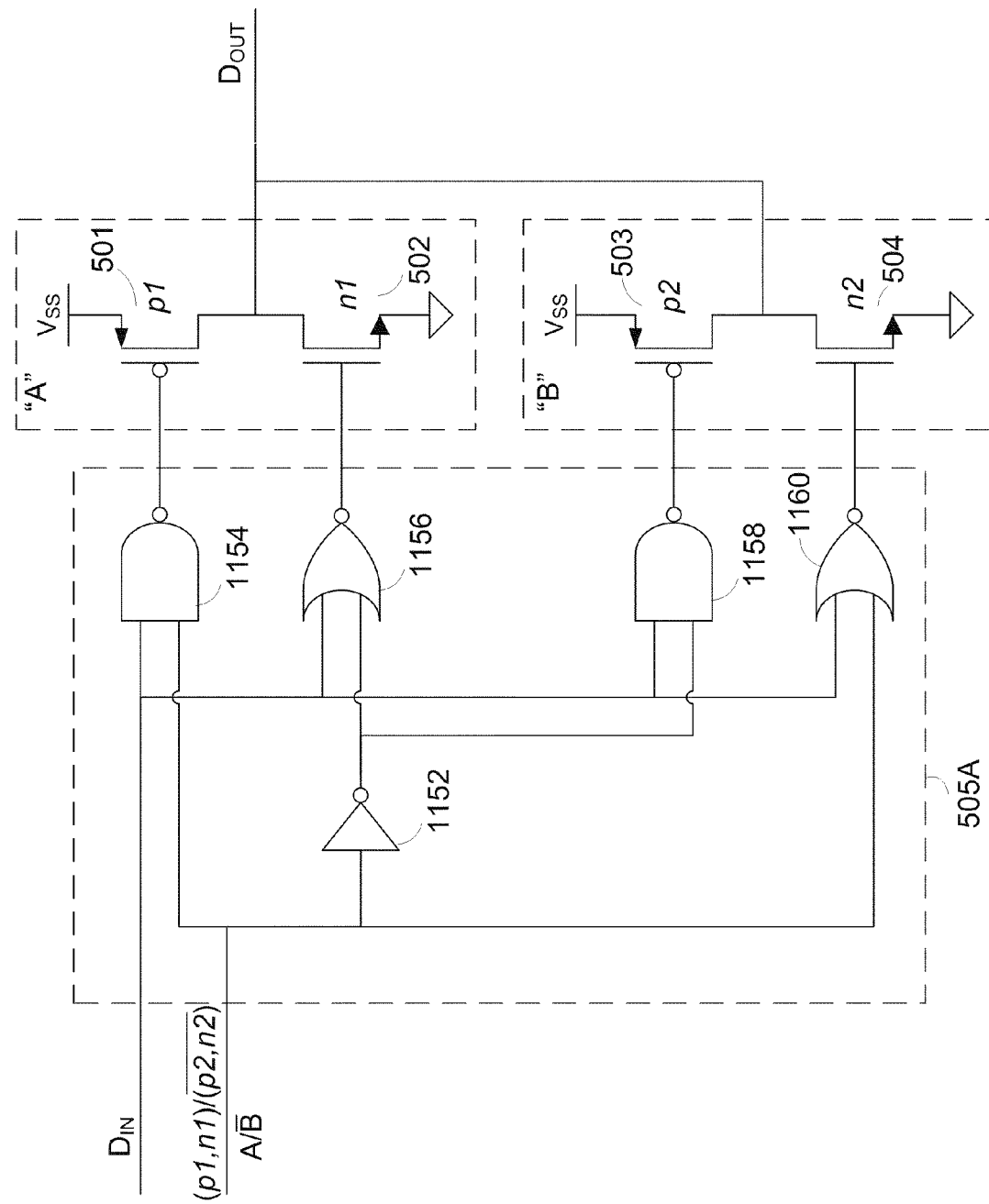
FIGS. 11B and 11C illustrate embodiments of a slew rate controller drawn with logic gate symbols.
Figure 11C:
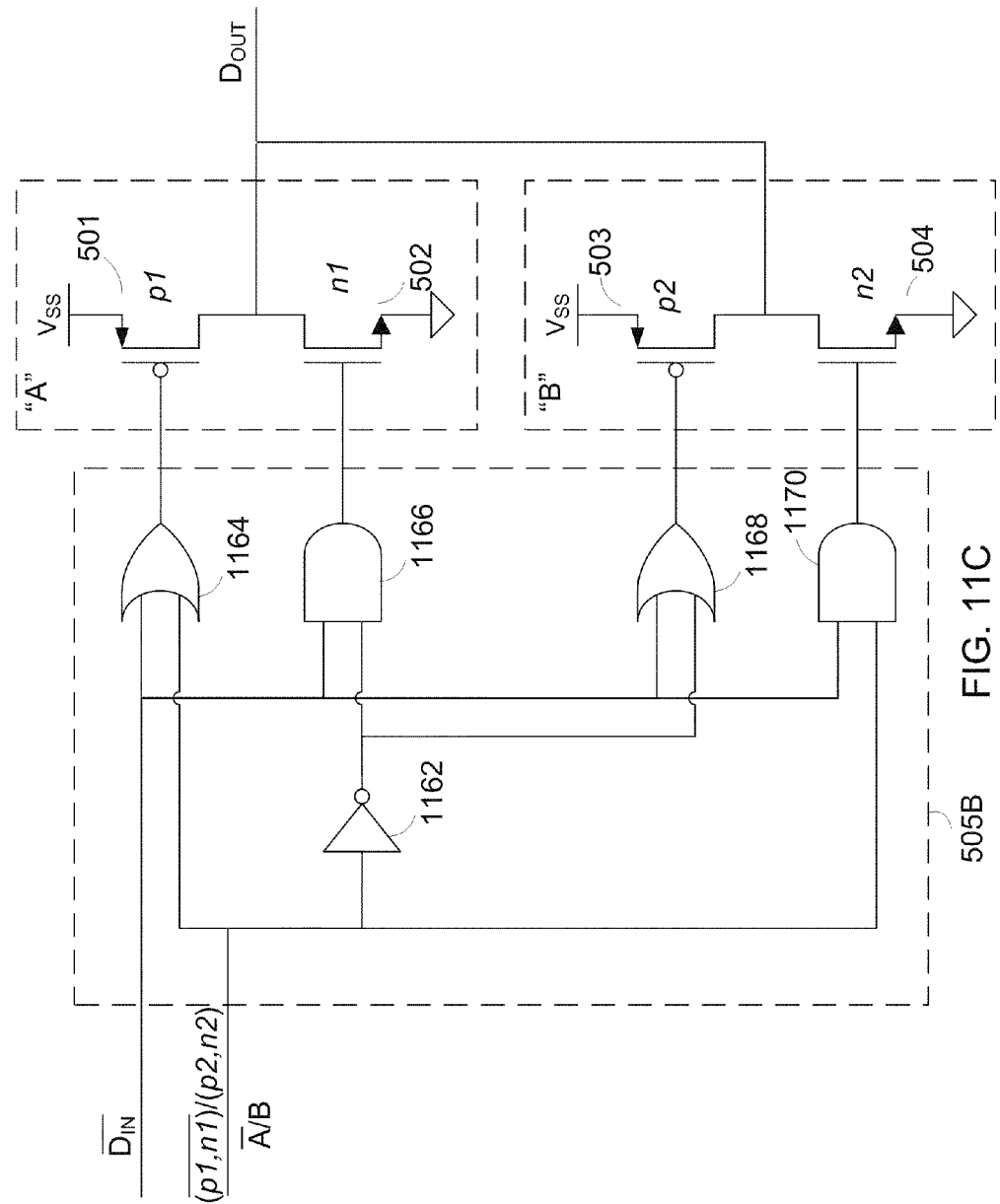

FIGS. 11B and 11C illustrate embodiments of a slew rate control circuit 505A, 505B drawn with logic gate symbols. The embodiment of FIG. 11B is non-inverting to data from input to output. The illustrated embodiment of FIG. 11B has an inverter 1152, a first NAND gate 1154, a first NOR gate 1156, a second NAND gate 1158, and a second NOR gate 1160. When it is desired to have p1 and n1 slew rates, then the control signal (p1,n1)/$\overline{(p2,n2)}$ is set to "high" which activates the "A" driver subcircuit and turns the "B" driver subcircuit to a high impedance state. When it is desired to have p2 and n2 slew rates, then the control signal (p1,n1)/$\overline{(p2,n2)}$ is set to "low" which activates the "B" driver subcircuit and turns the "A" driver subcircuit to a high impedance state.

The embodiment of FIG. 11C inverts data from input to output. Also note that the control signal (p1,n1)/$\overline{(p2,n2)}$ is inverted with respect to the control signal of FIGS. 11A and 11B. The illustrated embodiment of FIG. 11B has an inverter 1162, a first NAND gate 1164, a first NOR gate 1166, a second NAND gate 1168, and a second NOR gate 1170. When it is desired to have p1 and n1 slew rates, then the control signal $\overline{(p1,n1)}$/(p2,n2) is set to "low" which activates the "A" driver subcircuit and turns the "B" driver subcircuit to a high impedance state. When it is desired to have p2 and n2 slew rates, then the control signal $\overline{(p1,n1)}$/(p2,n2) is set to "high" which activates the "B" driver subcircuit and turns the "A" driver subcircuit to a high impedance state.

While illustrated in FIGS. 11A-11C in the context of 2 driver subcircuits per side (non-inverted and inverted side of a differential signal), more than 2 driver subcircuits can be used. In an alternative embodiment, the "B" driver subcircuit can be enabled all the time and the "A" driver subcircuit selectively enabled to change the number of transistors in parallel, which increases both the rising edge and the falling edge slew rates when the "A" driver is activated.

Figure 11D:
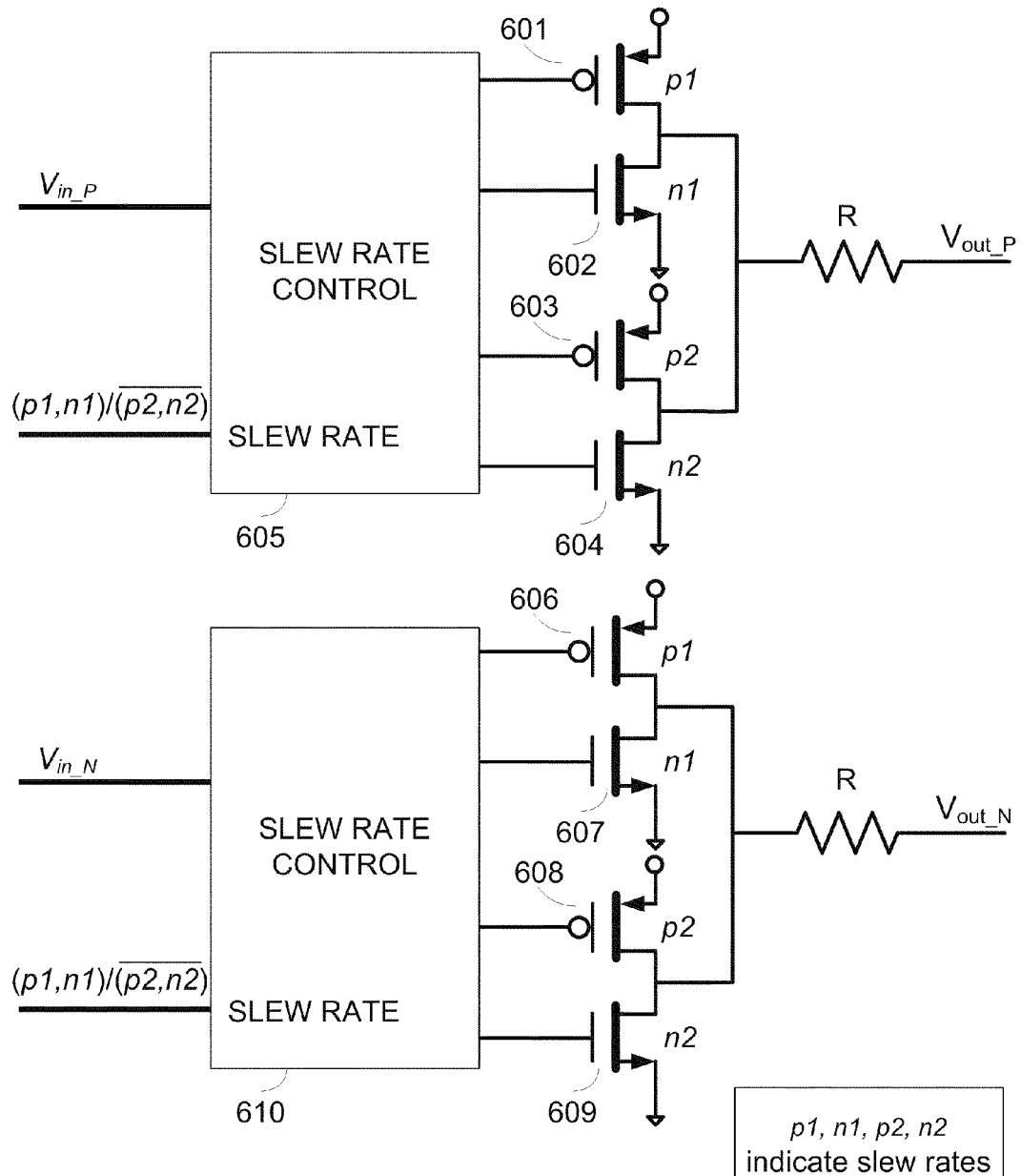
FIG. 11D illustrates the principle of FIG. 11A applied to differential circuits with a non-inverted signal $V_{out\_P}$ and an inverted signal $V_{out\_N}$.

FIG. 11D illustrates the principle of FIG. 11A applied to differential circuits with a non-inverted signal $V_{out\_P}$ and an inverted signal $V_{out\_N}$. The illustrated driver can be implemented with two of the single-ended driver circuits subcircuits described earlier in connection with FIG. 11A. As described earlier, it is impractical over process, voltage, and temperature (PVT) variations for the slew rates to be made equal such that p1 is equal to n2, and p2 is equal to n1. For relatively low jitter, the differential slew rates should be about equal as expressed in Equation 8. The differential slew rate is the sum of the absolute values of the slew rates of the non-inverted signal and the inverted signal. Due to matching, it is assumed that the slew rates p1, n2, p2, n2 for the non-inverted branch and the respective slew rates p1, n2, p2, n2 for the inverted branch can be the same.

$$p1+|n1|=p2+|n2| \tag{Eq. 8}$$

A p-channel transistor 601 and an n-channel transistor 602 form a first CMOS driver subcircuit, and a p-channel transistor 603 and an n-channel transistor 604 form a second driver subcircuit for the non-inverted branch of the output driver. A p-channel transistor 606 and an n-channel transistor 607 form a first CMOS driver subcircuit, and a p-channel transistor 608 and an n-channel transistor 609 form a second driver subcircuit for the inverted branch of the output driver. The slew rate control circuits 605, 610 can be controlled by feedback circuit (not shown) so that when the slew rate control circuit 605 activates the first driver circuit 601, 602 of the non-inverted branch, the slew rate control circuit 610 activates the first CMOS driver subcircuit 606, 607 of the inverted branch and the other driver subcircuits have high-impedance output. Similarly, when the slew rate control circuit 605 activates the second CMOS driver subcircuit 603, 604 of the non-inverted branch, the slew rate control circuit 610 switches on the second CMOS driver subcircuit 608, 609 of the inverted branch, and the other driver subcircuits have high-impedance output.

Thus, in a first state for the slew rate control circuits 605, 610 in which the non-inverted branch has a p1 rising edge slew rate and an n1 falling edge slew rate, the inverted branch also has a p1 rising edge slew rate and an n1 falling edge slew rate. In a second state for the slew rate control circuits 605, 610 in which the non-inverted branch has a p2 rising edge slew rate and an n2 falling edge slew rate, the inverted branch also has a p2 rising edge slew rate and an n2 falling edge slew rate.

In the first state for the slew rate control circuits 605, 610, the differential slew rate for the rising edge is the sum of the p1 slew rate of the non-inverted branch and the n1 slew rate of the inverted branch (p1+n1), and differential slew rate for the falling edge is the sum of the n1 slew rate of the non-inverted branch and the p1 slew rate (n1+p1) of the inverted branch. After switching from the first state to the second state of the slew rate control circuits 605, 610, the differential slew rate for the rising edge is the sum of the p2 slew rate of the non-inverted branch and the n2 slew rate of the inverted branch (p2+n2), and the differential slew rate for the falling edge is the sum of the n2 slew rate of the non-inverted branch and the p2 slew rate of the inverted branch (n2+p2). Thus, the switching should not add jitter to the transmitted differential signal.

Scalability is a useful feature of implementation of the drivers with CMOS. It is straightforward to scale transistors of a driver subcircuit by selecting the number of paralleled fingers for the transistors of the driver subcircuit. In addition, 2 or more driver subcircuits can be connected in parallel, with unused driver subcircuits left in a high-impedance state. For example, rather than activating only one of two driver subcircuits at a time, one or more driver subcircuits can be activated among two or more driver subcircuits.

An increase in the number of active driver subcircuits increases the slew rate, whereas a decrease in the number of active driver subcircuits decreases the slew rate. By selecting the number of driver subcircuits that are active, the slew rate of the driver as a whole can be modified in real time. By having multiple driver subcircuits with at least one driver circuit on at all times reduces glitches when switching slew rates and makes it practical to perform edge modulation at a rate that is independent of the data rate or is even asynchronous with the data rate. Glitches can be reduced or eliminated by having a relatively large number of activateable driver subcircuits, and making changes in relatively small steps such as a few percent of the driver subcircuits at a time. In one embodiment, to keep glitches from occurring, only a maximum of about 20% of the driver subcircuits are added in or taken out a time.

Figure 12A:
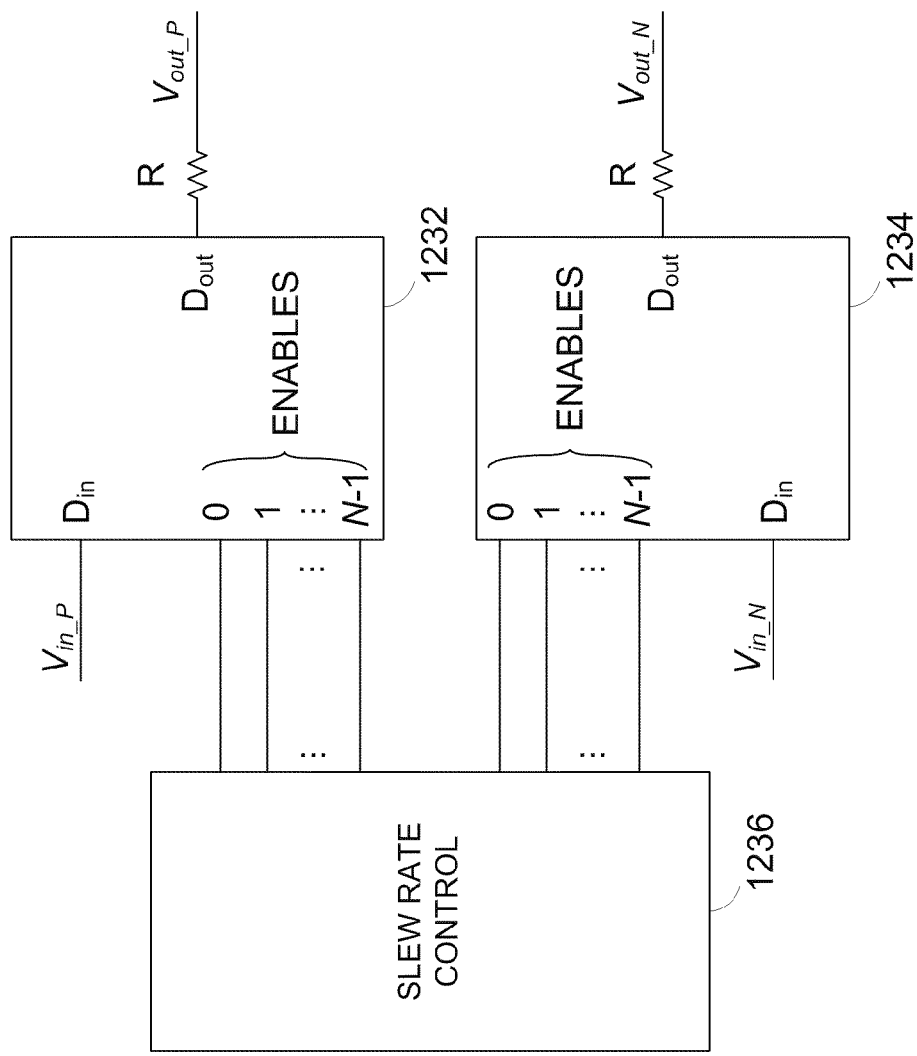
FIG. 12A illustrates a differential driver circuit with configurable slew rates.

FIG. 12A illustrates a differential driver circuit with configurable slew rates. FIG. 12A a driver 1232 for a non-inverted branch of the differential signal, a driver 1234 for an inverted branch of the differential signal, and a slew rate control circuit 1236. Each of the drivers 1232, 1234 contains N driver subcircuits. Preferably, the drivers 1232, 1234 are identical to each other with the same number N, but they do not need to be identical. The applicable value for N is at least two, but can vary in a very wide range. An appropriate number will depend on the application and will be readily determined by one of ordinary skill in the art. By adjusting the number of driver subcircuits enabled within each of the drivers 1232, 1234, the slew rate control circuit 1236 modifies the slew rate of the drivers 1232, 1234. The number of driver subcircuits enabled by the slew rate control circuit 1236 can vary from at least 1 to N. In one embodiment, since it is known that at least some of the driver subcircuits will be enabled, there can be driver subcircuits which are always on and not under control of the slew rate control circuit 1236. For example, N can be 50, and there can be 10 to 20 driver subcircuits that are always on. Output resistors R are for impedance matching. The value of the output resistors R can vary with the differential characteristic impedance of the transmission line. For example, when the differential characteristic impedance is 100 ohms, each output resistor R can have a value of about 50 ohms. One embodiment of a driver will be described in greater detail later in connection with FIG. 12B. One embodiment of the slew rate control circuit 1236 will be described in greater detail later in connection with block 1440 of FIG. 14, and FIGS. 15 and 16.

Figure 12B:
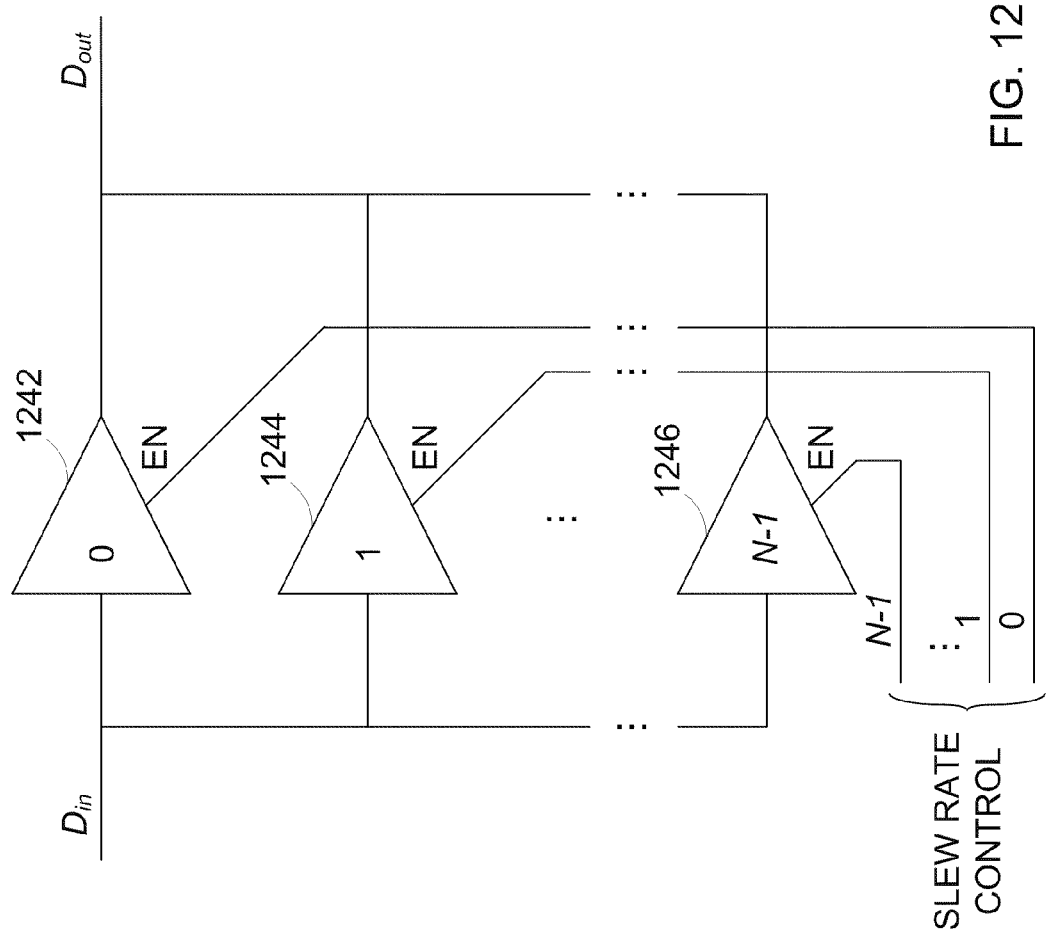
FIG. 12B illustrates an embodiment of a driver circuit.

FIG. 12B illustrates an embodiment of a driver circuit. The driver circuit includes N driver subcircuits. The value of N is at least 2. To compensate for PVT variations, it can be advantageous to have a relatively large number for N, such as 50. In one example, there are 50 total driver subcircuits, of which about 10 to 20 have deliberately asymmetrical rising edge and falling edge slew rates. In FIG. 12B, driver subcircuits 0, 1, and N−1 are drawn and numbered 1242, 1244, 1246. One embodiment of a driver subcircuit will be described in greater detail later in connection with FIG. 12C.

Each of the driver subcircuits 1242, 1244, 1246 has an input coupled to an input node and an output coupled to an output node such that the subcircuits are connected in parallel. Each driver subcircuit 1242, 1244, 1246 has an enable input which permits control of the driver subcircuit from at least one of an active mode or a high-impedance mode. At least one driver subcircuit should be active for each branch. Each of the enable inputs for the driver subcircuits can be individually controllable, but in some embodiments, it may be desirable to set relatively many of the driver subcircuits to be active or to have a driver subcircuit with relatively large output devices to be active all the time, and then to enable/disable other driver subcircuits for tuning or adjustment purposes. However, for testing purposes, it can be still be useful to permit control of each individual driver subcircuit by providing for individual control. As will be described later in connection with FIG. 13, the individual driver subcircuits do not need to be identical to each other. There can be driver subcircuits in parallel that are identical to each other, and then, depending on conditions, a driver subcircuit can be switched in that speeds up rising edge slew rates relative to falling edge slew rates or a different driver subcircuit can be switched in that speeds up falling edges slew rates relative to falling edge slew rates.

Figure 12C:
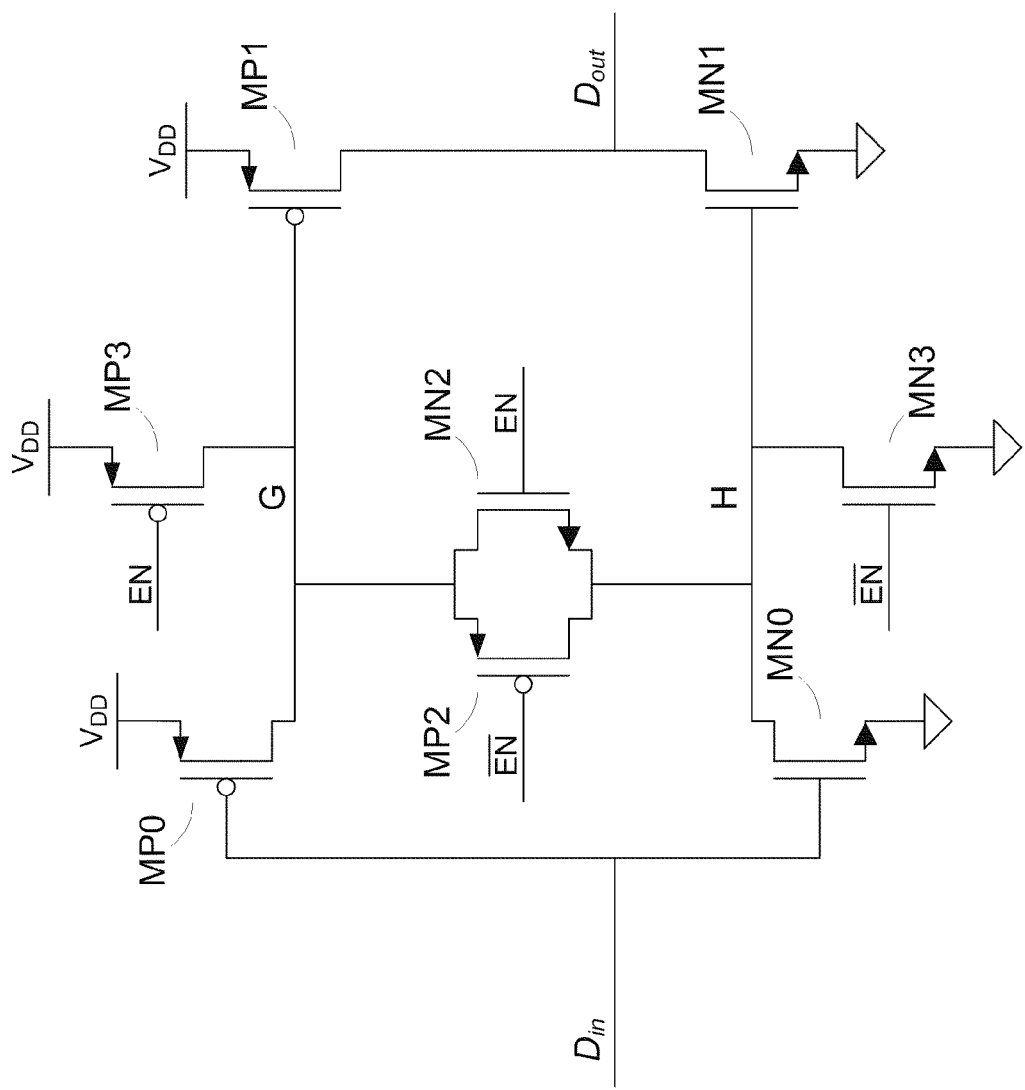
FIG. 12C illustrates an embodiment of a driver sub-circuit implemented in CMOS.

FIG. 12C illustrates an embodiment of a driver subcircuit implemented in CMOS. While a particular embodiment is shown, variations will be readily determined by one of ordinary skill in the art. For example, while the illustrated embodiment is non-inverting from input $D_{in}$ to output $D_{out}$, the circuit can alternatively be inverting.

Returning to the illustrated embodiment of FIG. 12C, the driver subcircuit has an input $D_{in}$, an output $D_{out}$, and at least one of a "true" or active high enable EN input, and a "false" or active low enable $\overline{EN}$ input. The active high enable EN input and the active low enable $\overline{EN}$ input are logically complements or inverses of the other, and can be generated from one another. The driver subcircuit has a first PMOS transistor MP0, a second PMOS transistor MP1, a third PMOS transistor MP2, and a fourth PMOS transistor MP3. In addition, the driver subcircuit also has a first NMOS transistor MN0, a second NMOS transistor MN1, a third NMOS transistor MN2, and a fourth NMOS transistor MN3. For explanatory purposes, a node "G" and a node "H" are also illustrated in FIG. 12C. The node G corresponds to the drain of the first PMOS transistor MP0, the drain of the fourth PMOS transistor MP3, the gate of second PMOS transistor MP1, the drain of third NMOS transistor MN2, and the source of the third PMOS transistor MP2. The node H corresponds to the drain of the first NMOS transistor MN0, the drain of the fourth NMOS transistor MN3, the gate of second NMOS transistor MN1, the drain of third PMOS transistor MP2, and the source of the third NMOS transistor MN2.

There are two possible states for the driver subcircuit. When the driver subcircuit is to be activated (active mode), the active high enable EN input is set high and the active low enable $\overline{EN}$ is set low. When the driver subcircuit is to be placed in a high-impedance mode, the active high enable EN input is set low, and the active low enable $\overline{EN}$ is set high. These levels bias the transistors as explained as follows.

In the active mode, the fourth PMOS transistor MP3 and the fourth NMOS transistor MN3 are both turned off by the biasing described above, and the third PMOS transistor MP2 and a third NMOS transistor MN2 are both turned on by the biasing described above. This action couples node G and H together, and the circuit effectively functions as 2 CMOS inverters in series. The first CMOS inverter is effectively formed by the first PMOS transistor MP0 and a second NMOS transistor MN0. A second CMOS inverter is effectively formed by the second PMOS transistor MP1 and the second NMOS transistor MN1. Accordingly, the logical state at nodes G and H is the inverse of the input $D_{in}$, which is then inverted by a second CMOS inverter to generate the output $D_{in}$, which is not inverted with respect to the input $D_{in}$.

In the high-impedance mode, the third PMOS transistor MP2 and the third PMOS transistor MN2 are turned off, and the fourth PMOS transistor MP3 and the fourth NMOS transistor MN3 are turned on. This electrically separates nodes G and H from each other. Further, the turning on of the fourth PMOS transistor MP3 and the fourth NMOS transistor MN3 place a "high" on node G, and a "low" on node H. A "high" can be, for example, $V_{DD}$, and a "low" can be, for example, $V_{SS}$ or ground. With a "high" applied to the gate of the second PMOS transistor MP1, the transistor MP1 is off. With a "low" applied to the gate of the second NMOS transistor MN1, the transistor MN1 is off. Since both the second PMOS transistor MP1 and the second NMOS transistor MN1 are turned off, the output $D_{out}$ is in a high-impedance state.

The rising edge and falling edge slew rates of a driver the number of driver subcircuits enabled and the characteristics of those individual driver subcircuits, which is determined primarily by the "on" resistances of the output devices MP1, MN1, any additional series resistance that may be present, and the capacitance on the output node $D_{out}$, $V_{out}$. It should be noted that due to differences in charge carrier mobility, PMOS devices have higher "on" resistance than similarly-sized NMOS devices, so that for similar slew rates, the PMOS output devices and NMOS output devices will typically not be the same size. In addition, it should be noted that as devices become larger, the parasitic capacitances can also increase, which can also affect slew rate characteristics.

Figure 13:
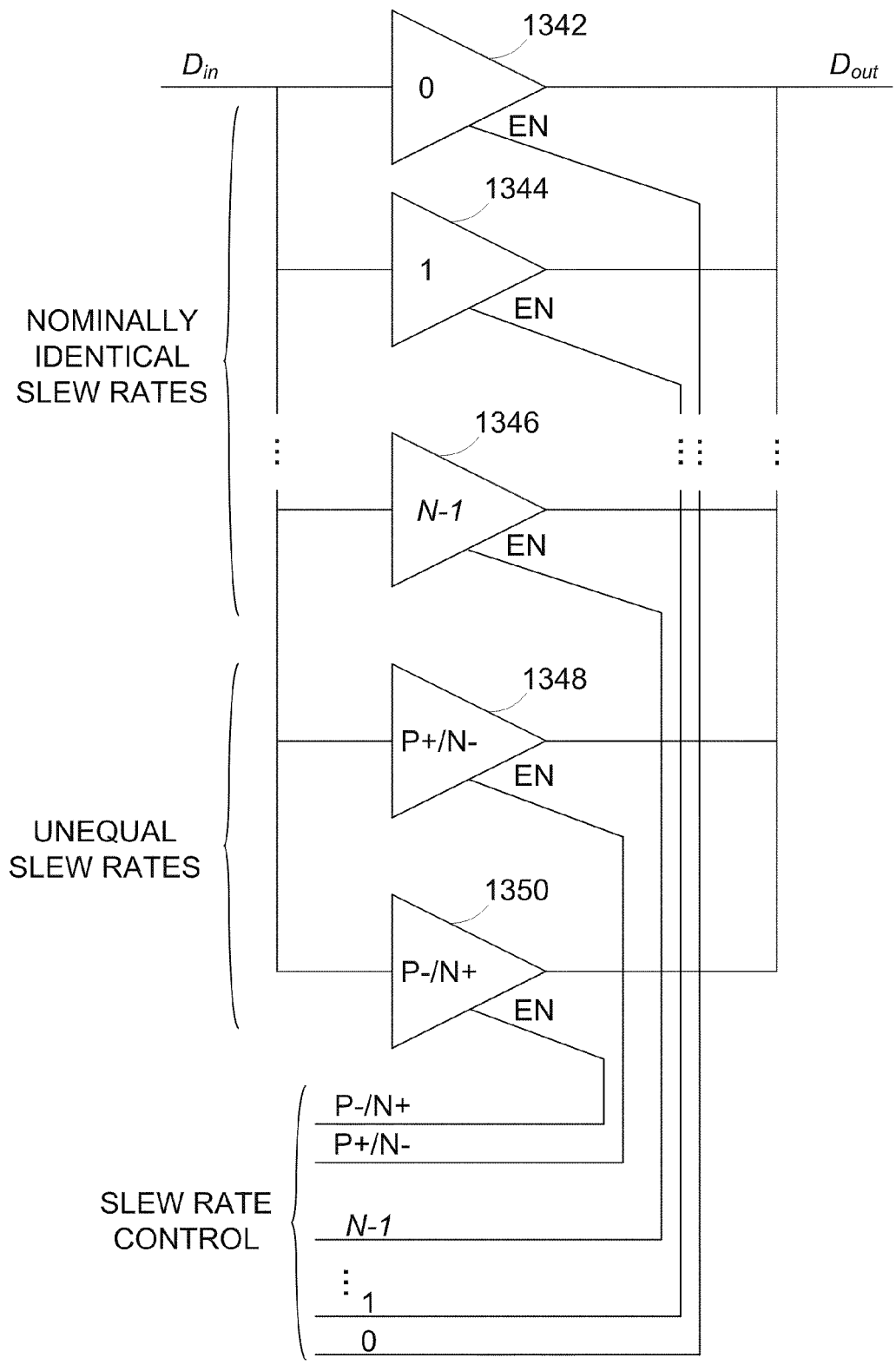
FIG. 13 illustrates an embodiment of a CMOS driver circuit with configurable slew rate characteristics.

FIG. 13 illustrates an embodiment of a CMOS driver circuit with configurable slew rate characteristics. In the illustrated embodiment, there are N "unit" driver subcircuits 1342, 1344, 1346 of nominally identical slew rates for both rising edges and falling edges. The number N can vary in a very wide range and can be 1 or more in the illustrated embodiment. However, for adaptability, it can be advantageous to have a relatively large number, such as 10. In the illustrated embodiment, each of the N unit driver subcircuits 1342, 1344, 1346 is identical to each other. For example, during the design process, the unit driver subcircuits 1342, 1344, 1346 can be instantiated from the same macro. In addition to these N unit driver subcircuits 1342, 1344, 1346, the CMOS driver circuit has one or more first-type imbalanced driver subcircuits 1348 and one or more second-type imbalanced driver subcircuit 1350 that have imbalanced slew rate characteristics. These imbalances in slew rate characteristics permit correction of slew rate characteristics and/or to generate frequency spurs that at least partially cancel EMI from other frequency spurs. Of course, additional imbalanced drivers can be used to correct slew rate imbalances for finer control.

For the purposes of example, with each of the N unit driver subcircuits 1342, 1344, 1346 enabled during operation, the slew rate is p0 for rising edges and n0 for falling edges. While the N unit driver subcircuits 1342, 1344, 1346 can be intended to have a matched rising edge p0 slew rate and falling edge n0 slew rate, the p0 and n0 slew rates will not remain matched over process, voltage, and temperature (PVT) variations. For example, over PVT, the mismatch between the p0 and n0 slew rates can be expected to vary, but the mismatch in slew rates of a well-designed circuit without independently configurable rising edge and falling edge slew rates will typically not vary by more than about 5 percent.

Imbalances in slew rate can be corrected and/or frequency spurs can be at least partially canceled using one or more of the first-type imbalanced driver subcircuits 1348 or one or more of the second-type imbalanced driver subcircuits 1350.

When activated, a first-type imbalanced driver subcircuits 1348 increases the rising edge slew rate relative to the falling edge slew rate. In one embodiment, the first-type imbalanced driver subcircuits 1348 includes both a PMOS output device MP1 (FIG. 12C) and an NMOS output device MN1 (FIG. 12C). The rising edge slew rate can be enhanced relative to the falling edge slew rate by, for example, making the PMOS output device MP1 larger relative to the NMOS output device MN1. In one example, when one or more of the first-type imbalanced driver subcircuits 1348 is activated, one or more of the N unit driver subcircuits 1342, 1344, 1346 is deactivated.

In an alternative embodiment, the one or more first-type imbalanced driver subcircuits 1348 can be activated without explicit deactivation of one or more of the N unit driver subcircuits 1342, 1344, 1346. In yet another alternative embodiment, the one or more first-type imbalanced driver subcircuits 1348 has only the PMOS output device MP1, does not have the NMOS output device MN1, and is activated without deactivation of one or more of the N unit driver subcircuits 1342, 1344, 1346. Of course, combinations of these first-types are also possible.

When activated, the one or more second-type imbalanced driver subcircuits 1350 increase the falling edge slew rate relative to the rising edge slew rate. The falling edge slew rate can be enhanced relative to the rising edge slew rate by, for example, making the PMOS output device MP1 smaller relative to the NMOS output device MN1. In one example, when the one or more second-type imbalanced driver subcircuits 1350 is activated, one or more of the N unit driver subcircuits 1342, 1344, 1346 is deactivated. In an alternative embodiment, the one or more second-type imbalanced driver subcircuits 1350 can be activated without explicit deactivation of one or more of the N unit driver subcircuits 1342, 1344, 1346. In yet another alternative embodiment, the one or more second-type imbalanced driver subcircuits 1350 has only the NMOS output device MN1, does not have the PMOS output device MP1, and is activated without deactivation of one or more of the N unit driver subcircuits 1342, 1344, 1346.

By utilizing relatively many of the first-type imbalanced driver subcircuits 1348 and the second-type imbalanced driver subcircuits 1350, the slew rates can be adjusted in relatively fine steps. For example, in one embodiment, there can be 10 instances of the unit driver subcircuits 1342, 1344, 1346, 10 instances of the first-type imbalanced driver subcircuits 1348, and 10 instances of the second-type imbalanced driver subcircuits 1350. When each of the first-type imbalanced driver subcircuits 1348 and the second-type imbalanced driver subcircuits 1350 are sized to change the rising edge or the falling edge slew rate by about 0.5% relative to a unit driver subcircuit, the rising edge or the falling edge slew rates can be adjusted plus or minus 5% in 0.5% increments, which should be sufficient to cover variations over process, voltage, and temperature (PVT).

The particular driver subcircuits to activate can be selected by a controller. The controller can be implemented using hardware or software/firmware or via a combination of hardware and software/firmware. Software/firmware can comprise computer executable instructions stored on a tangible medium, such as a non-volatile memory.

Process variations are static, that is, batches of devices can vary from each other due to process variations, but the particular process variations of a device do not change once a device has been fabricated. Typically, process variations are the dominant source of slew rate mismatches. Process variations occur when the circuit is being fabricated. A calibration procedure implemented during production test can be used to correct slew rate mismatches due to process variations. The setting can be stored in non-volatile memory and retrieved during operation as a starting point. However, it should be noted that the characteristics of a device can change over time as the device ages, and that voltage and temperature variations occur in the field during use.

The process variations can be corrected or compensated during production test or by an adaptive feedback procedure during operation. Voltage and temperature variations should be adaptively corrected during operation.

Assuming that the driver has passed normal operability tests (tests for function), these following procedures are applicable and can be performed during production test. The procedure can be performed manually or in an automated manner. In one embodiment, the subcircuits 1342, 1344, 1346, 1348, 1350 (FIG. 13) are selectively enabled for either or both relatively good matching of rising edge and falling edge slew rates, or for finding offsetting slew rates for reduction of frequency spurs.

For example, automated test equipment (ATE) can determine rising edge slew rates and falling edge slew rates, or alternatively, rise times and fall times, for a variety of combinations of selections of the subcircuits 1342, 1344, 1346, 1348, 1350 (FIG. 13). It should be noted that for a batch of circuits common to a die, the results of the test can be similar for all the circuits, and that a representative sampling of the circuits can suffice for calibration purposes.

The test procedure can test a variety of combinations of subcircuits to find the resulting rising edge and falling edge slew rates (under the test conditions voltage and temperature). For example, unit subcircuits 1342, 1344, 1346 can be enabled until slew rates are generally in a desired range. This can initially include all the unit subcircuits 1342, 1344, 1346. Then, the imbalanced driver subcircuits 1348, 1350 can be enabled, with one or more unit subcircuits 1342, 1344, 1346 possibly deactivated, until the various slew rates of the combinations are determined. For example, the determination can be performed via brute force. In the description that follows, rise time and fall time will be used as the measured quantity instead of slew rates. Rise and fall times are readily observable characteristics for test equipment such as oscilloscope. For example, the rise time or fall times can be the time it takes for a signal to rise or fall from 10-90%. Other percentage ranges can be used.

The procedure can be repeated for both the non-inverting branch and the inverting branch of the driver. Typically, however, the non-inverting branch and the inverting branch should test similarly, for example, should have the same rise and fall times, but it should be noted that it is the rise time of one that is ultimately matched with the fall time of the other, and vice versa.

For the purposes of illustration, it will be assumed that the particular rise times and fall times discussed below are identical for the non-inverting branch and for the inverting branch, which is a relatively good approximation for a practical circuit. After analysis of the rise times and the fall times, the process selects at least a first configuration resulting in a rising edge slew rate p1 and a falling edge slew rate n1 (FIG. 11D), and a second configuration resulting a rising edge slew rate p2 and a falling edge slew rate n2 (FIG. 11D). The at least two selected configurations should be complementary to each other. For example, one configuration should have a faster rising edge slew rate p1 than a falling edge slew rate n1, and the other configuration should have a faster falling edge slew rate n2 than a rising edge slew rate p2. In one embodiment, the configurations selected are the two configurations that meet the foregoing criterion with the smallest difference between rise times and fall times.

For the purposes of illustration, in one example, a first configuration (p1, n1) is selected that has a corresponding rise time ($t_r$) of 55 picoseconds (ps) and a fall time ($t_f$) of 40 ps. The $t_r$–$t_f$ difference is +15 ps. A second configuration (p2, n2) is selected that has a corresponding rise time of 40 ps and a fall time of 61 ps, for which the $t_r$–$t_f$ difference is –21 ps. These configurations can be stored in nonvolatile memory and retrieved for operation. For example, during operation, a randomizer can be used in an open loop control to select between the two configurations, which can reduce frequency spurs over the use of the first configuration with a 15 ps difference between rise and fall times alone. The randomizer can be implemented in firmware or in hardware by, for example, generation of a pseudo random binary sequence (PRBS), by delta sigma modulation with programmable increments, or the like. In one example, a PRBS generator is gated to stop or hold at particular states, which then changes the probability of ones and zeroes.

The two configurations setting can be stored in non-volatile memory such as in EEPROM, Flash, fuse, antifuse, etc., and used by a controller of a slew rate control 505, 510 (FIG. 11D). The controller can be implemented by execution of instructions by a microprocessor (firmware). In addition, the PRBS generator or randomizer can be configured to have different probabilities for the two states (one state corresponding to activation of the first configuration and the other state corresponding to activation of the second configuration) such that the spurious frequency response is reduced.

Figure 14:
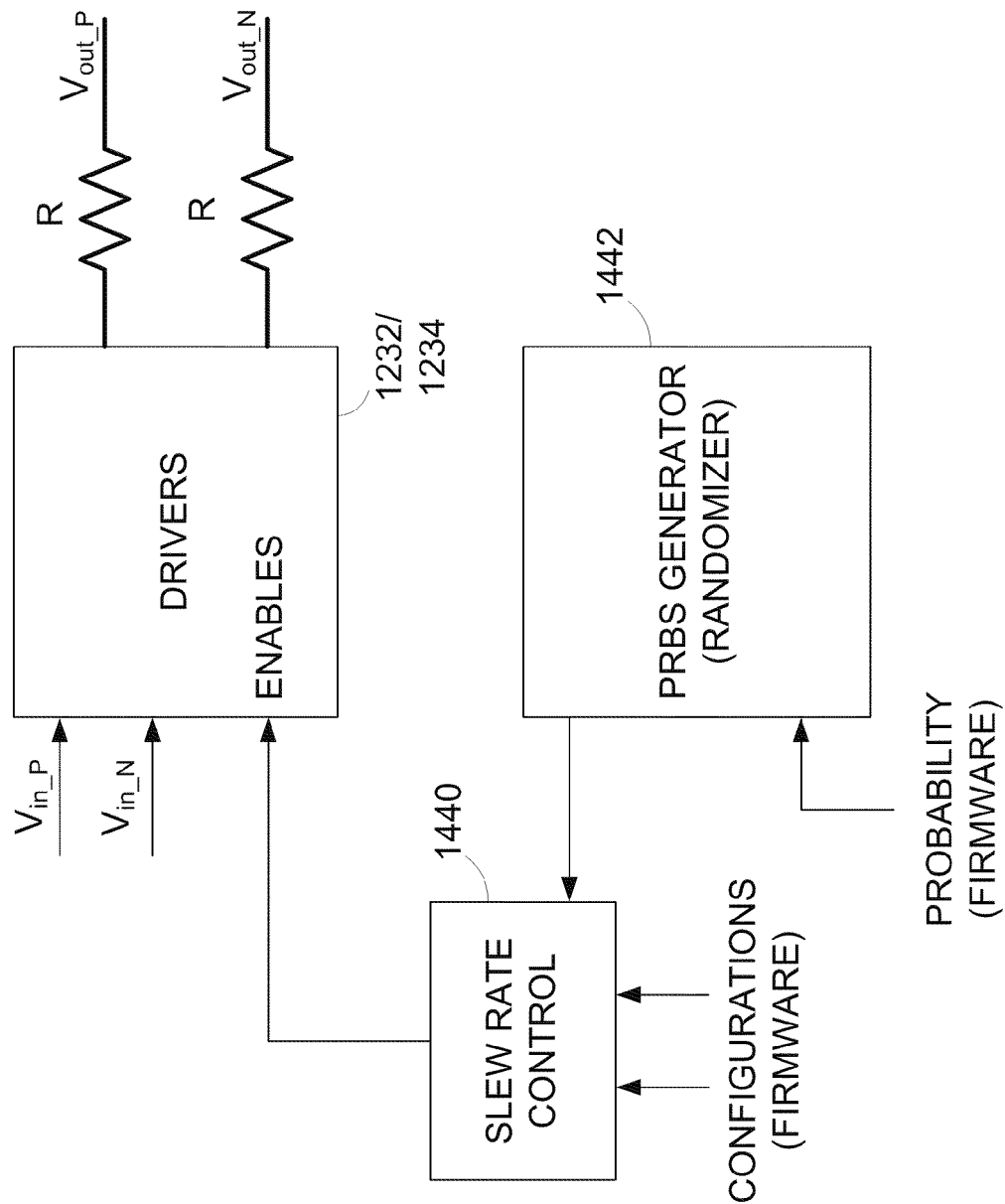
FIG. 14 illustrates an open-loop embodiment of the invention.

FIG. 14 illustrates an open-loop embodiment of the invention. For example, the applicable drivers to enable can be loaded to a slew rate control circuit 1440 by firmware. For example, the first configuration (p1, n1) and the second configuration (p2, n2) can be stored in registers, such as D-flip flops, of the slew rate control circuit 1440. A multiplexer within the slew rate control circuit 1440 can select between the two configurations for the drivers 1232/1234. The selection by the multiplexer can be controlled by output states of a PRBS generator 1442 or randomizer. The firmware can load an applicable sequence to the PRBS generator 1442, can load a different probability for the two states, and the like. In an alternative embodiment, a feedback system is utilized. When feedback is used, the calibration routine described earlier can be avoided.

Figure 15:
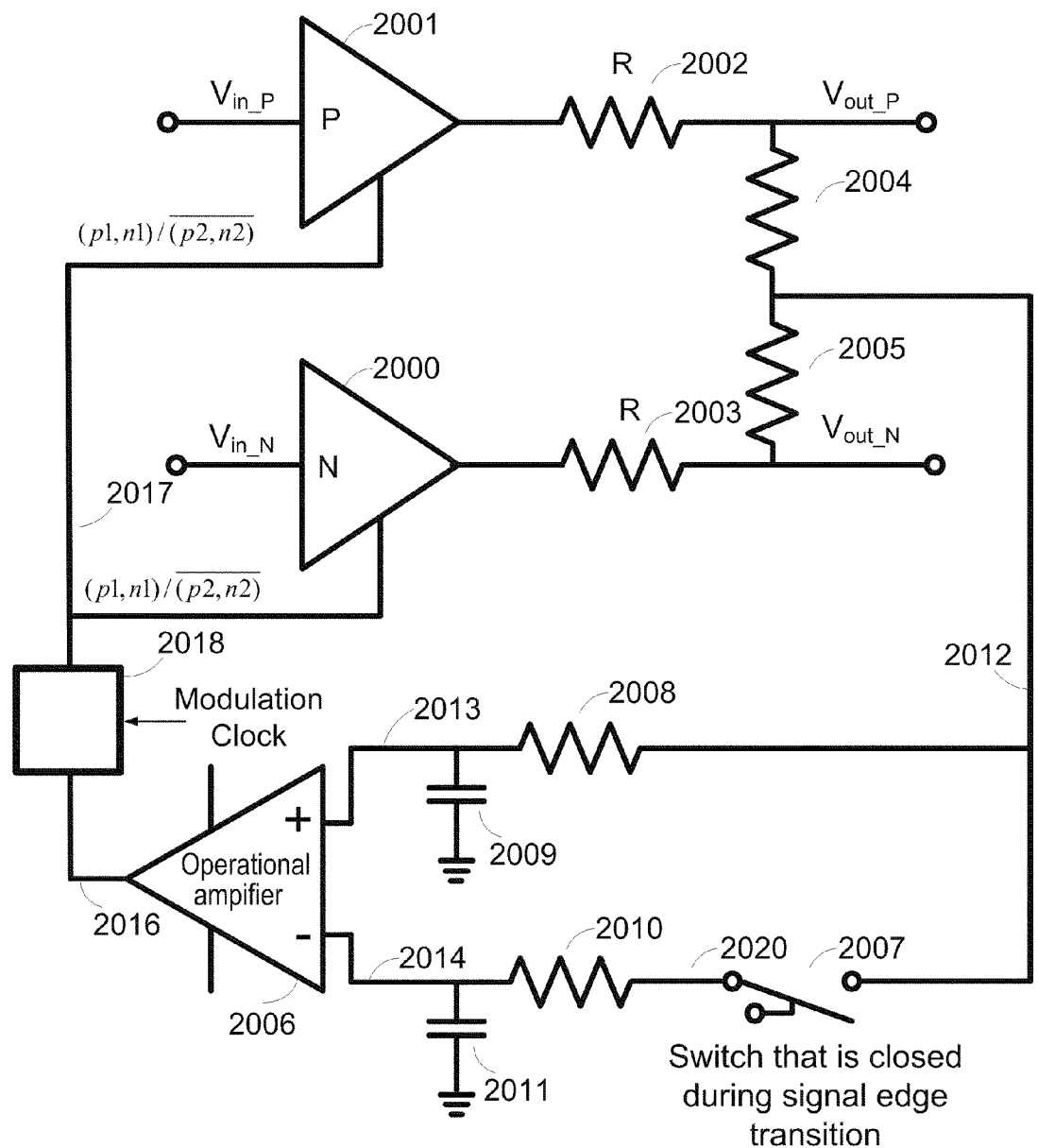
FIG. 15 illustrates a feedback loop embodiment of the invention.
Figure 16:
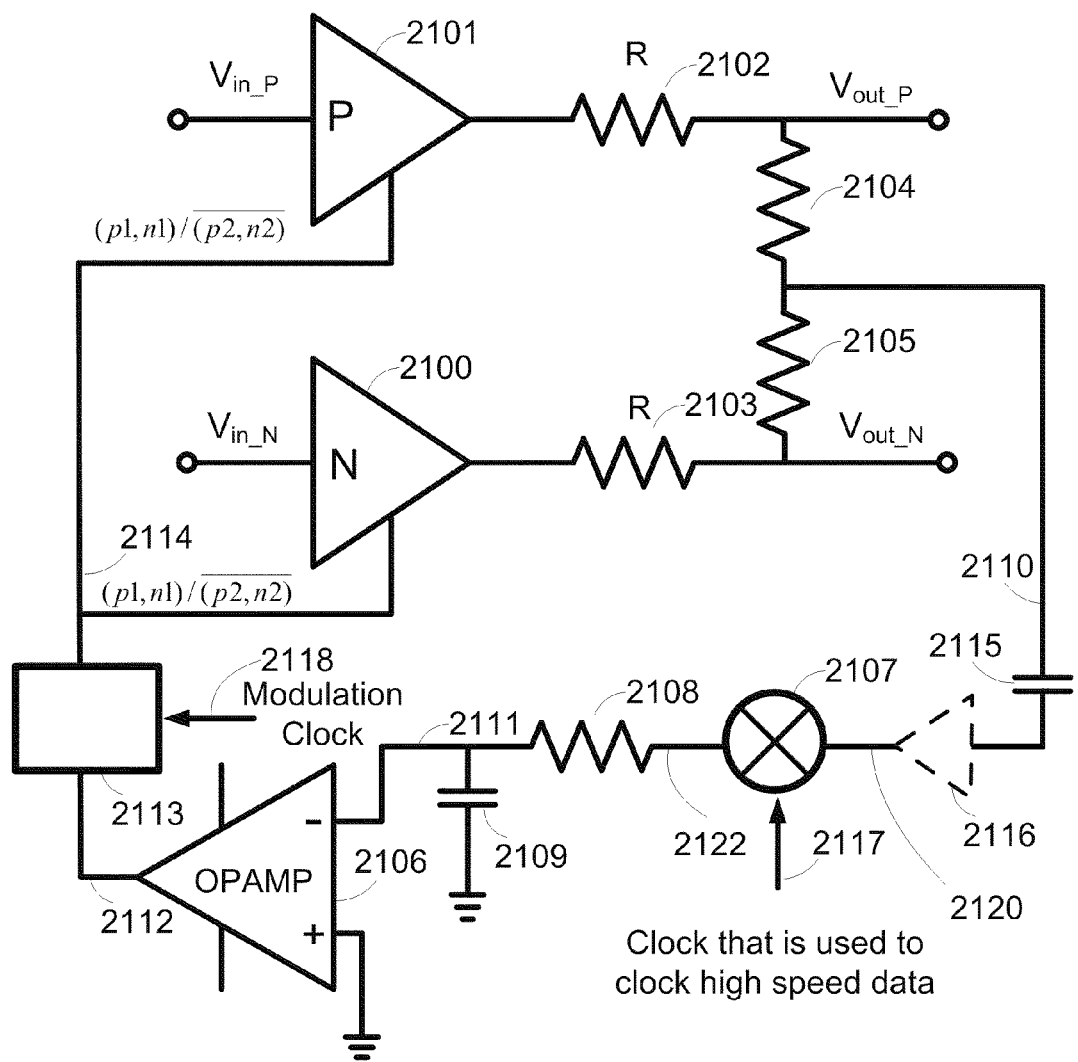
FIG. 16 illustrates an alternative feedback loop embodiment of the invention.

FIGS. 15 and 16 illustrate feedback loop embodiments of the invention. In the embodiment illustrated in FIG. 15, a reference signal for control of configurable slew rate or delay modulation drivers is generated by low-pass filtering outputs of a differential drivers. FIG. 15 illustrates a non-inverting driver 2001 and an inverting driver 2000, both of which are capable of edge slew rate or delay modulation.

Output resistors R 2002, 2003 are shown in FIG. 12A. An observed common mode signal 2012 is generated by summing output signals through resistors 2004, 2005, which should be matched in value. The observed common mode signal 2012 is filtered using a relatively long RC time constant low-pass filter, which can be implemented by a resistor 2008 and a capacitor 2009, to generate a filtered common mode signal 2013, which represents an average of the common mode. Other low-pass filters can be used and would be readily determined by one of ordinary skill in the art. The RC time constant for the filter formed by the resistor 2008 and the capacitor 2009 should be relatively long to provide a stable DC reference signal for observation of the common mode and should not be affected by switching. The precise time constant is not critical and can be made arbitrarily large, such as 10,000 to 100,000 times the period for a symbol.

The observed common mode signal 2012 is gated or windowed by a switch 2007 to generate a gated common mode signal 2020, which captures the transition period or edges in which the output signals $V_{out\_P}$ and $V_{out\_N}$ are changing. The control for the switch 2007 can be generated in a variety of ways, such as a simple differentiation of the clock signal.

The gated common mode signal 2020 is filtered by a low-pass filter represented in FIG. 15 by a resistor 2010 and a capacitor 2011 to generate a filtered gated common mode signal 2014. Other low-pass filters can be used and would be readily determined by one of ordinary skill in the art. The time constant of the low pass filter should be much smaller than the other low-pass filter represented by the resistor 2008 and the capacitor 2009. The difference between the filtered gated common mode signal 2014 and the filtered common mode signal 2013 can be amplified with a low DC offset (for example, chopper stabilized) operational amplifier 2006 and to generate an amplified difference signal 2016.

Assuming that the rising edges of the output signals $V_{out\_P}$ and $V_{out\_N}$ have the same characteristics and that the falling edges of the output signals $V_{out\_P}$ and $V_{out\_N}$ have the same characteristics, then when the rising edges are faster than the falling edges, the filtered gated common mode signal 2014 should be higher in voltage than the filtered common mode signal 2013, both of which are provided as inputs to an operational amplifier 2006. The applied control voltage should then increase the fraction of the period in which the rising slew rate is slower than the falling edge. By contrast, when the filtered gated common mode signal 2014 is lower in voltage than the filtered common mode signal 2013, then the fraction of the period in which the rising edge slew rate is faster than the falling edge slew rate should be increased.

A randomization block or randomizer 2018 generates a control signal 2017 from the amplified difference signal 2016, which can be used to generate, for example, the control signal (p1,n1)/$\overline{(p2,n2)}$ described earlier in connection with FIG. 11A. For example, the randomizer 2018 can implement the Pseudo Random Binary Sequence (PRBS) described earlier in connection with FIGS. 10A and 10B.

The clock rate for modulation can be chosen independently of the data or symbol rate, and can vary, for example, from 0.10% of the data rate to 1% of the data rate. In one embodiment, even more than 1% of the data rate is used. Higher modulation rates for the randomizer 2018 should provide better spur reduction. With a randomizer modulation frequency of approximately 1% of frequency of the data rate, an EMI reduction of 20 dB can be expected. In the illustrated embodiment, the probability of selecting one state (p1,n1/p2,n2) versus the other state (p2,n2/p1,n1) for the drivers 2001, 2000 is determined by the output level of the amplified difference signal 2016.

FIG. 16 illustrates an alternative feedback loop embodiment of the invention. Output resistors R 2102, 2103 prevent glitches as described earlier in connection with FIG. 12A. An observed common mode signal 2110 is generated by summing the output signals $V_{out\_P}$, $V_{out\_N}$ of a non-inverting driver 2101 and an inverting driver 2100 through resistors 2104, 2105, which should be matched in value.

The DC component of the observed common mode signal 2110 is filtered with a capacitor 2115, which implements AC coupling and passes the high frequency components of the observed common mode signal 2110 to an optional high frequency amplifier 2116. Of course, other techniques can be used to remove DC components, such as subtracting a DC component. While the use of the amplifier 2116 is optional, the amplifier 2116 decreases the dependency on DC offset problems associated with an operational amplifier 2106. A filtered common mode signal 2120 (amplified or not) is provided as an input to a mixer 2107. The filtered common mode signal 2120 should not have a DC component.

The mixer 2107 mixes the filtered common mode signal 2120 with a data rate clock signal 2117 to generate a down-converted common mode signal 2122. The data rate clock signal 2117 has edges that are in phase with data edges of the output signals $V_{out\_P}$, $V_{out\_N}$ to downconvert the filtered common mode signal 2120 via the mixer 2107.

The down-converted common mode signal 2122 is low-pass filtered, such as via a resistor 2108 and a capacitor 2109 to generate a filtered down-converted common mode signal 2111. The filtered down-converted common mode signal 2111 is positive when rising edges of the output signals $V_{out\_P}$, $V_{out\_N}$ are faster than falling edges, for example, have lower rise times than fall times, and the filtered down-converted common mode signal 2111 is negative when the rising edges are slower than the falling edges, for example, have longer rise times than fall times. If the filtered down-converted common mode signal 2111 has a negative polarity, then the fraction of the period in which the rising edge slew rate is faster than the falling edge slew rate should be increased. When the filtered down-converted common mode signal 2111 is positive, then the fraction of the period in which the rising edge slew rate is faster than the falling edge slew rate should be decreased. The polarity of the filtered down-converted common mode signal 2111 can be determined using a relatively low DC offset (such as, chopper stabilized) operational amplifier 2106, which amplifies a difference between the filtered down-converted common mode signal 2111 and a voltage reference, in this case, ground. An amplified difference signal 2112 output of the operational amplifier 2106 is provided as an input to a randomizer 2113. The randomizer 2113 modulates the amplified difference signal 2112 to generate a randomized output signal 2114, such as via delta-sigma modulation techniques.

The randomization block 2113 generates a randomized output signal 2114 from the amplified difference signal 2112, which can be used to generate, for example, the control signal (p1,n1)/$\overline{(p2,n2)}$ described earlier in connection with FIG. 11A. For example, the randomizer 2018 can implement the Pseudo Random Binary Sequence (PRBS) described earlier in connection with FIGS. 10A and 10B. The modulation clock signal 2118 for the randomizer 2113 can be chosen independently of the data rate and can range from 0.1% of the data rate to 1% of the data rate or even higher. Typically, the higher the randomizer clock frequency, the better the spur reduction that should occur. For a randomizer circuit clock signal with a frequency of approximately 1% of the data rate frequency, about a 20 dB EMI reduction can be expected. The probability of selecting one state versus another is determined by a level of the amplified difference signal 2112.

Various techniques can be used for the modulation of the amplified difference signal 2016 (FIG. 15), 2112 (FIG. 16) into the randomized output signal 2016 (FIG. 15), 2114 (FIG. 16). For example, the density of the one state versus the other can be controlled by with delta-sigma or via a modification of a PRBS generator and input from the feedback circuit (amplified difference signal 2112 of FIG. 16). The particular implementation does not matter as long the modulated common mode signal spectrum has constant power spectral density in the vicinity of data rate frequency and harmonics of data rate frequencies.

Figure 17A:
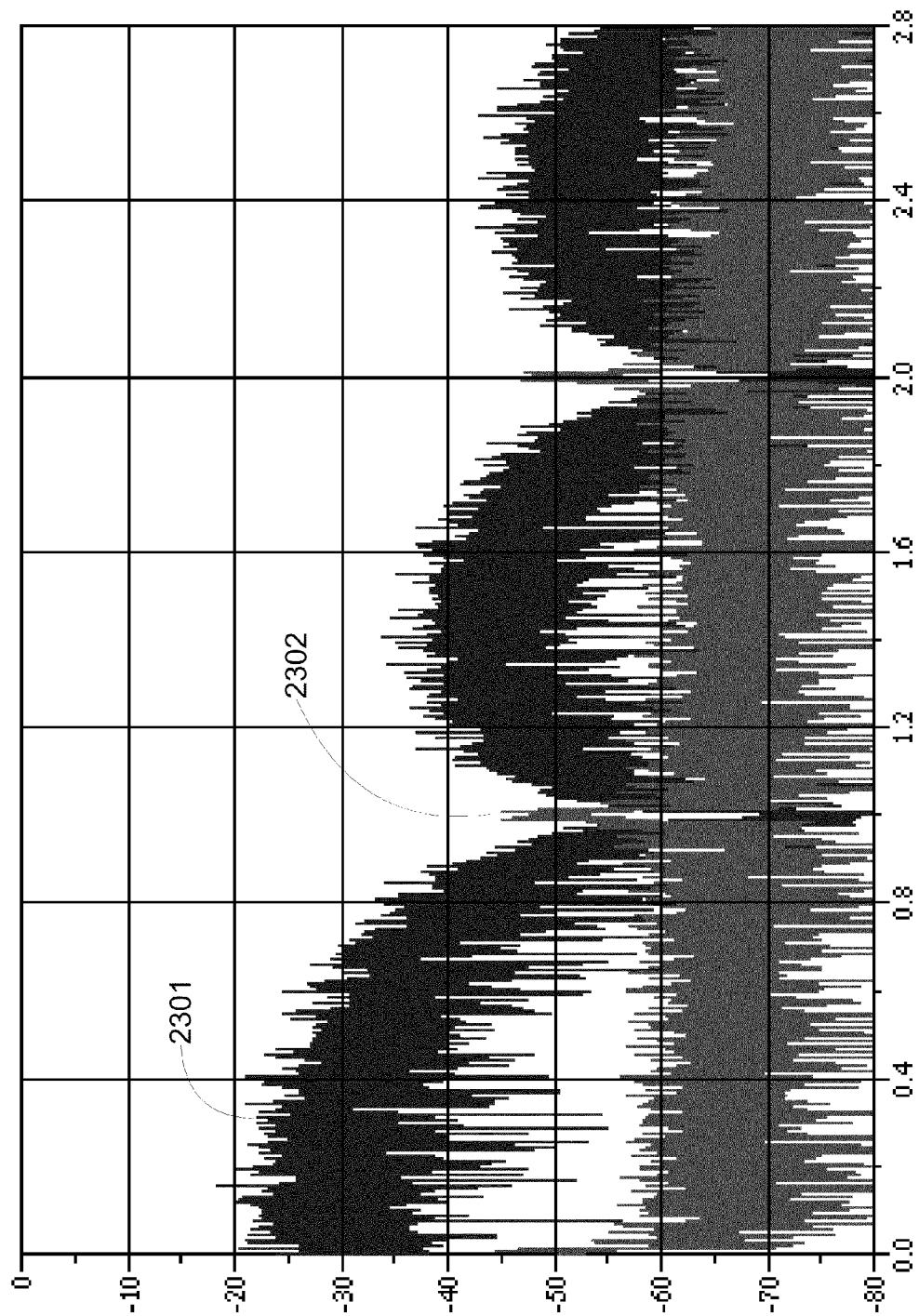
FIG. 17A illustrates a simulated power spectrum for a data signal and for a common mode signal produced by an embodiment of the invention using edge modulation.

FIG. 17A illustrates a simulated power spectrum for a data signal 2301 and for a common mode signal 2302 produced by an embodiment of the invention using edge modulation. Power is expressed along a vertical axis, and frequency normalized to the symbol rate is expressed along a horizontal axis.

Figure 17B:
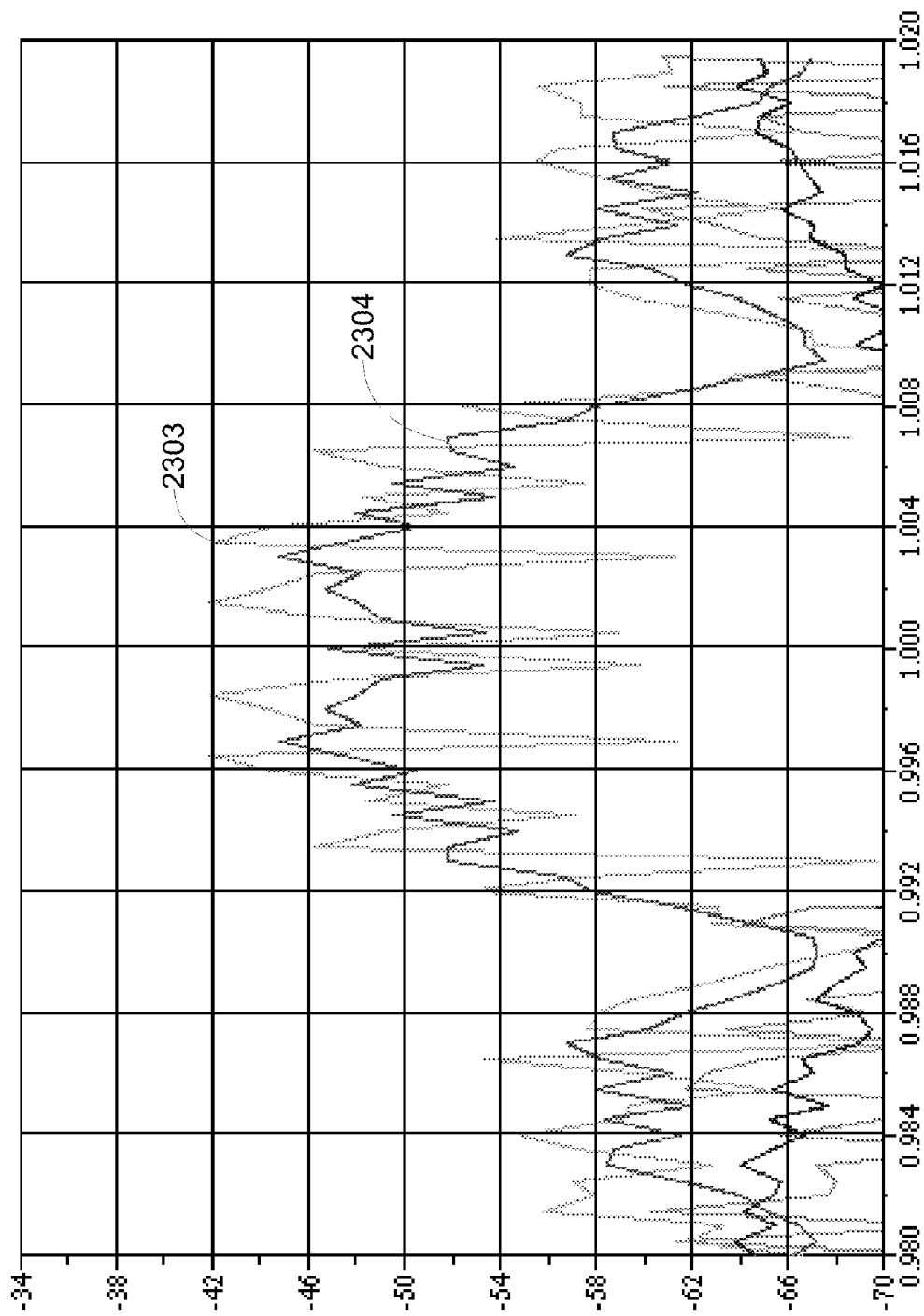
FIG. 17B illustrates a close up view of the common mode signal spectrum showing both average and instantaneous power spectral density.

FIG. 17B illustrates a close up view of the comone mode signal spectrum showing both an instantaneous common mode signal power spectral density 2303 and an average common mode signal power spectral density 2304.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

As used herein, a "node" means any internal or external reference point, connection point, junction, signal line, conductive element, or the like at which a given signal, logic level, voltage, data pattern, current, or quantity is present. Furthermore, two or more nodes may be realized by one physical element (and two or more signals can be multiplexed, modulated, or otherwise distinguished even though received or provided as an output at a common node).

Various embodiments have been described above. Although described with reference to these specific embodiments, the descriptions are intended to be illustrative and are not intended to be limiting. Various modifications and applications may occur to those skilled in the art.

What is claimed is:

1. An apparatus for driving a differential signal, the apparatus comprising:
 a first output node for a non-inverted output signal of a differential signal;
 a second output node for an inverted output signal of the differential signal;
 a first driver subcircuit having an output coupled to the first output node;
 a second driver subcircuit having an output coupled to the second output node; and
 a slew rate control circuit responsive to a slew rate control input to selectively activate transistors of the first driver subcircuit and the second driver subcircuit;
 wherein in response to a first state of the slew rate control input, transitions at the first output node and the second output node have a first rising edge slew rate and a first falling edge slew rate, wherein the first rising edge slew rate is faster than the first falling edge slew rate;
 wherein in response to a second state of the slew rate control input, transitions at the first output node and the second output node have a second rising edge slew rate and a second falling edge slew rate, wherein the second rising edge slew rate is slower than the second falling edge slew rate.

2. The apparatus of claim 1, further comprising a modulator configured to select between the first state and the second state in a pseudo random manner.

3. The apparatus of claim 2, wherein the modulator comprises a pseudo random binary sequence generator.

4. The apparatus of claim 2, wherein the modulator comprises a delta sigma modulator.

5. The apparatus of claim 1, further comprising a modulator configured to select between the first state and the second state in a pseudo random manner and in an open loop manner.

6. The apparatus of claim 1, further comprising a modulator configured to select between the first state and the second state in a pseudo random manner and in a closed loop manner such that the probability of selecting one state versus the other varies depending upon a difference in a signal associated with a common mode signal detected during transitions of the differential signal.

7. The apparatus of claim 6, wherein the signal associated with the common mode signal comprises a filtered gated common mode signal.

8. The apparatus of claim 1, further comprising:
 a mixer configured to mix a signal associated with a common mode signal with a data rate clock signal;
 a low-pass filter configured to low pass filter an output of the mixer to generate a filtered down-converted common mode signal; and
 a modulator configured to select between the first state and the second state in a pseudo random manner and in a closed loop manner such that the probability of selecting one state versus the other varies based at least partly on the filtered down-converted common mode signal.

9. A method of driving a differential signal, the method comprising:
 driving a first output node for a non-inverted output signal of a differential signal with a first driver subcircuit;
 driving a second output node for an inverted output signal of the differential signal with a second driver subcircuit;
 receiving a slew rate control signal as an input; and
 selectively activating transistors of the first driver subcircuit and the second driver subcircuit based at least partly on the slew rate control signal such that in response to a first state of the slew rate control input, transitions at the first output node and the second output node have a first rising edge slew rate and a first falling edge slew rate, wherein the first rising edge slew rate is faster than the first falling edge slew rate, and such that in response to a second state of the slew rate control input, transitions at the first output node and the second output node have a second rising edge slew rate and a second falling edge slew rate, wherein the second rising edge slew rate is slower than the second falling edge slew rate.

10. The method of claim 9, further comprising modulating between the first state and the second state in a pseudo random manner.

11. The method of claim 10, further comprising generating a pseudo random binary sequence for modulating.

12. The method of claim 9, wherein modulating further comprises performing delta-sigma modulation.

13. The method of claim 9, further comprising selecting between the first state and the second state in a pseudo random manner and in an open loop manner.

14. The method of claim 9, further comprising selecting between the first state and the second state in a pseudo random manner and in a closed loop manner such that the probability of selecting one state versus the other varies depending upon a difference in a signal associated with a common mode signal detected during transitions of the differential signal.

15. The method of claim 14, further comprises gating and filtering a common mode signal to generate the signal associated with the common mode signal.

16. The method of claim 9, further comprising:
  mixing a signal associated with a common mode signal with a data rate clock signal to generate a mixed signal;
  low-pass filtering the mixed signal to generate a filtered down-converted common mode signal; and
  selecting between the first state and the second state in a pseudo random manner and in a closed loop manner such that the probability of selecting one state versus the other varies based at least partly on the filtered down-converted common mode signal.

17. A method of compensating for process variations resulting in variability in slew rate, the method comprising:
  observing slew rates of an output driver, wherein the output driver comprises a plurality of driver subcircuits, at least a portion of which can be selectively activated; and
  selectively activating driver subcircuits of the plurality of driver subcircuits so that a rising edge slew rate approximately matches with a falling edge slew rate.

18. The method of claim 17, further comprising exhaustively testing various combinations of driver subcircuits for slew rate.

19. The method of claim 17, further comprising activating at least one driver subcircuit with a deliberately mismatch between its rising edge slew rate and its falling edge slew rate to compensate for variability of driver subcircuits in which mismatch is not intended.

\* \* \* \* \*